(12) United States Patent
Kato

(10) Patent No.: US 7,763,883 B2
(45) Date of Patent: Jul. 27, 2010

(54) IMAGE DISPLAY DEVICE

(75) Inventor: Takashi Kato, Kanagawa (JP)

(73) Assignee: Fujifilm Corporation, Tokyo (JP)

(*) Notice: Subject to any disclaimer, the term of this patent is extended or adjusted under 35 U.S.C. 154(b) by 383 days.

(21) Appl. No.: 11/401,252

(22) Filed: Apr. 11, 2006

(65) Prior Publication Data
US 2006/0243949 A1 Nov. 2, 2006

(30) Foreign Application Priority Data
Apr. 13, 2005 (JP) .............. 2005-115848

(51) Int. Cl.
H01L 35/24 (2006.01)
H01L 51/00 (2006.01)

(52) U.S. Cl. .............. 257/40; 257/E51.001

(58) Field of Classification Search .......... 257/40
See application file for complete search history.

(56) References Cited

U.S. PATENT DOCUMENTS

| 5,998,626 A * | 12/1999 | Sato .............. 548/219 |
| 2002/0040976 A1* | 4/2002 | Usami et al. .......... 252/301.28 |
| 2003/0160235 A1* | 8/2003 | Hirai .............. 257/40 |
| 2005/0143501 A1* | 6/2005 | Sato et al. .......... 524/104 |
| 2006/0047971 A1* | 3/2006 | Miyazaki et al. .......... 713/186 |
| 2006/0215253 A1* | 9/2006 | Kanbe .............. 359/296 |

FOREIGN PATENT DOCUMENTS

| JP | 62-85467 A | 4/1987 |
| JP | 5-110069 A | 4/1993 |
| JP | 2002-80788 A | 3/2002 |
| JP | 2003057817 A * | 2/2003 |
| JP | 2003315549 A * | 11/2003 |
| JP | 2004102223 A * | 4/2004 |
| JP | 2005-5582 A | 1/2005 |
| WO | WO 0106816 A1 * | 1/2001 |

OTHER PUBLICATIONS

Machine Translation of JP 2004-102223.*
Machine Translation of JP 2003-057817.*
Machine Translation of JP 2003-315549.*

* cited by examiner

Primary Examiner—Eugene Lee
Assistant Examiner—Anthony Ho
(74) Attorney, Agent, or Firm—Birch, Stewart, Kolasch & Birch, LLP

(57) ABSTRACT

An image display apparatus, including a substrate, a transparent electrode layer, a field-effect transistor that includes a gate insulator and a semiconductive layer containing an organic compound, a display layer having optical properties that change in response to an electric field, and a layer containing a fluorescent brightener that absorbs 90% or more of light having a wavelength of 200 nm to 410 nm.

15 Claims, 4 Drawing Sheets

IMAGE DISPLAY DEVICE

CROSS-REFERENCE TO RELATED APPLICATION

This application claims priority under 35 U.S.C. 119 from Japanese Patent Application No. 2005-115848, the disclosure of which is incorporated by reference herein.

BACKGROUND OF THE INVENTION

1. Field of the Invention

The invention relates to an image display apparatus that displays image information due to a change in the optical properties thereof caused by an applied electric field.

2. Description of the Related Art

Various display modes for image display apparatuses known as electronic papers are known. Examples of the display modes proposed for image display apparatuses include a microcapsular electrophoretic display displaying an image by electrophoretic movement of positively charged white particles and negatively charged black particles, a cholesteric-liquid-crystal selective-reflection display displaying an image by selective reflection by a cholesteric liquid crystal formed with a chiral agent and a nematic liquid crystal, and the like.

The modes of applying voltage to a display layer having optical properties that change in response to an electric field, in the image display apparatuses include, for example, a passive mode of applying voltage by using a single matrix electrode, and an active mode of applying voltage by using a field-effect transistor. The active drive mode is characteristically faster in display velocity, higher in definition of the display image, and superior in reproducing a halftone image than the passive mode.

The field-effect transistor used in the active drive mode includes a gate insulator and a semiconductive layer, and amorphous silicon or polysilicon has been used as the semiconductive layer. However, recently, use of an organic compound has been proposed for the semiconductive layer. Use of an organic compound is expected to be effective in improving properties such as flexibility of the field-effect transistor and the productivity thereof in the coating method, compared to use of an inorganic compound. Examples of the films of organic conjugated polymer that have been used as the semiconductive layer in the field-effect transistor include π-conjugated polymer thin films prepared by electrolytic polymerization (see, for example, Japanese Patent Application Laid-Open (JP-A) No. 62-85467), films prepared by coating a solution of a π-conjugated polymer or the precursor thereof (see, for example, JP-A No. 5-110069), and the like.

The organic compounds have a problem of low durability, when used as the semiconductive layer. A method of adding an ultraviolet absorber to the organic semiconductive layer has been proposed for improvement in the durability (see, for example, JP-A No. 2005-5582), but remains unsatisfactory.

Further, as for a fluorescent brightener absorbing light at 410 nm or less at an absorbance of 90%, use of benzoxazole derivatives as a coating has been disclosed (see, for example, JP-A No. 2002-80788).

SUMMARY OF THE INVENTION

The present invention has been developed in view of the above circumstances, and provides an image display apparatus that is less vulnerable to degradation by irradiation of a UV light in the wavelength range of 200 to 410 nm, which comes from outside of the apparatus and/or from the apparatus itself.

An aspect of the invention provides an image display apparatus, including a substrate, a transparent electrode layer, a field-effect transistor that includes a gate insulator and a semiconductive layer containing an organic compound, a display layer having optical properties that change in response to an electric field, and a layer containing a fluorescent brightener that absorbs 90% or more of light having a wavelength of 200 nm or more and 410 nm or less.

The layer containing a fluorescent brightener may further comprise an ultraviolet absorber.

The fluorescent brightener may be a benzoxazole derivative.

The benzoxazole derivative may be represented by the following Formula (1):

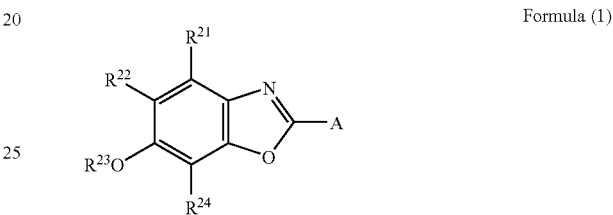

Formula (1)

In Formula (1), $R^{21}$ and $R^{24}$ each represent a hydrogen atom, an alkyl group or an alkoxy group; $R^{22}$ and $R^{23}$ each represent an alkyl group; and A represents a substituted aryl group or a substituted ethenyl group.

The display layer may be an electrophoretic display layer.

The display layer may be a guest-host liquid crystal display layer.

The semiconductive layer may further comprise pentacene or oligothiophene.

A dichroic dye contained in the guest-host liquid crystal display layer may be an anthraquinone dye or a phenoxazine dye.

The invention provides an image display apparatus that is less vulnerable to degradation by irradiation of a UV light in the wavelength range of 200 to 410 nm, which comes from outside of the apparatus and/or from the apparatus itself.

DETAILED DESCRIPTION OF THE INVENTION

Figure 1:
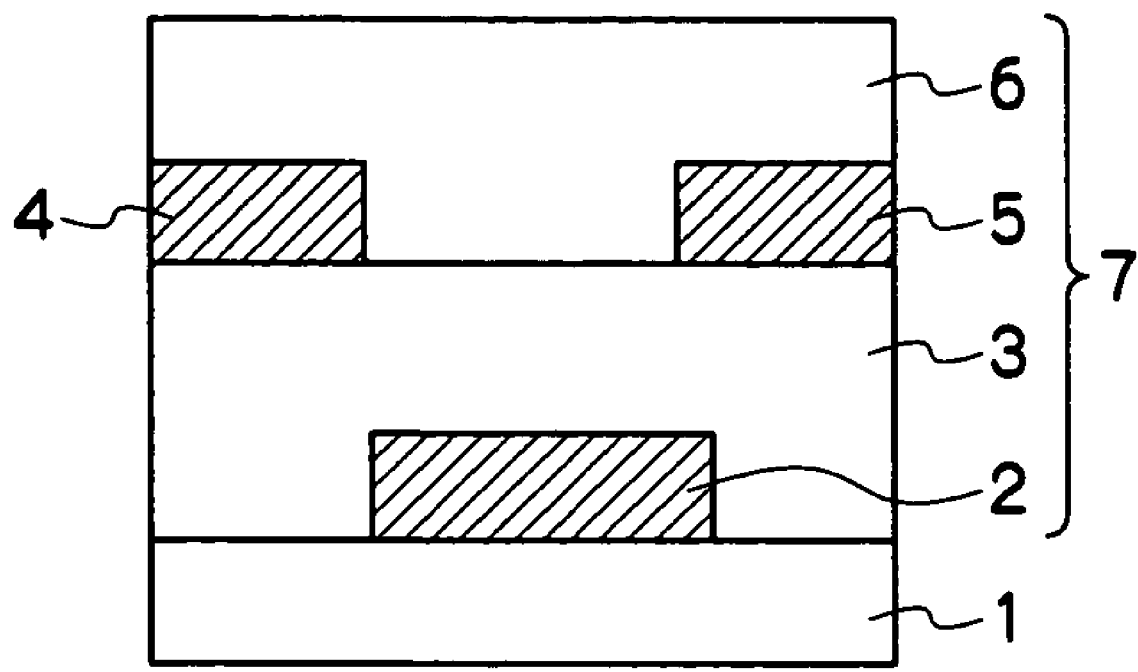
FIG. 1 is a schematic sectional view illustrating a field-effect transistor according to the invention including a gate insulator and a semiconductive layer containing an organic compound.

The image display apparatus according to the invention includes a substrate, a transparent electrode layer, a field-effect transistor including a gate insulator and a semiconductive layer containing an organic compound, a display layer having optical properties that change in response to an electric field, and a layer containing a fluorescent brightener that absorbs 90% or more of light having a wavelength of 200 nm or more and 410 nm or less.

When an organic compound is used in a semiconductive layer, durability against ultraviolet ray is sometimes deteriorated. However, the present invention has made it possible to raise durability of the semiconductive layer by additionally providing a layer containing a fluorescent brightener that absorbs 90% or more of light having a wavelength of 200 nm to 410 nm.

It is preferable to provide an additional layer containing a fluorescent brightener compared to containing an ultraviolet absorber in a semiconductive layer since it makes possible to improve durability without deteriorating properties of the semiconductive layer.

Hereinafter, the invention will be described in detail.

<Substrate>

The examples of the substrate that can be used in the invention include plastic substrates, glass plates, paper, metal substrates, and the like, and plastic substrates are preferable. Examples of the plastic substrates include those of triacetylcellulose (TAC), polyethylene terephthalate (PET), polyethylene naphthalate (PEN), syndiotactic polystyrene (SPS), polyphenylene sulfide (PPS), polycarbonate (PC), polyarylate (PAr), polysulfone (PSF), polyester sulfone (PES), polyether imide [PEI], cyclic polyolefin, polyimide (PI), and the like. Preferable is polyethylene terephthalate (PET).

A resin having a thermal expansion coefficient of 30 ppm/° C. or lower is preferable as the resin. The thermal expansion coefficient was determined by using TMA8310 (ThermoPlus series product, manufactured by Rigaku Denki Co., Ltd.). Other examples of the resins include PET (Toray Lumirror, 15 ppm/° C.), PEN (Q65A, manufactured by DuPont-Teijin, 20 ppm/° C.), PI (Upilex, manufactured by Ube Industries. Ltd., 20 ppm/° C.), aramide resin (manufactured by Teijin Ltd., 2 ppm/° C.), and the like.

Alternatively, it is also possible to prepare a resin having a thermal expansion coefficient of 30 ppm or less by adding an inorganic material such as glass cloth or glass fiber to a resin having a glass transition point (Tg) of 150° C. or higher described below by sol-gel method.

Preferable examples thereof (temperature in parenthesis: Tg) include polycarbonate resins (e.g., Tarflon PC, manufactured by Idemitsu Kosan Co., Ltd., 140° C.), alicyclic polyolefin resins (e.g., Zeonor 1600, manufactured by Zeon Corporation, 160° C.; and Arton, manufactured by JSR Co., Ltd., 170° C.), polyarylate resins (U polymer PAr, manufactured by UNITIKA Ltd., 210° C.), polyether sulfone resins (polyether sulfone PES, manufactured by Sumitomo Chemical, 220° C.), polysulfone resins (Toraysulfone PSF, manufactured by Toray, 190° C.), polyester resins (e.g., O-PET, manufactured by Kanebo Ltd., 125° C., polyethylene terephthalate, and polyethylene naphthalate), cycloolefin copolymers (COC: compound in Example 1 of JP-A No. 2001-150584, 162° C.), fluorene ring-modified polycarbonate resins (BCF-PC: compound in Example 4 of JP-A No. 2000-227603, 225° C.), aliphatic ring-modified polycarbonate resins (IP-PC: compound in Example 5 of JP-A No. 2000-227603, 205° C.), and acryloyl compounds (compound in Example 1 of JP-A No. 2002-80616, 300° C. or higher). Other preferable examples include polycarbonate resins having a bisphenol represented by the following Formula (A) as its bisphenol component.

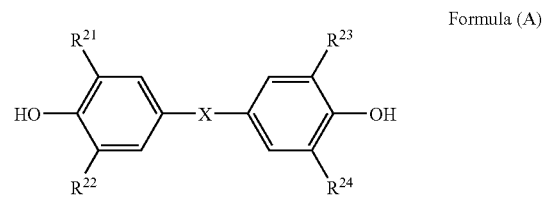

Formula (A)

In Formula (A), $R^{21}$, $R^{22}$, $R^{23}$ and $R^{24}$ each independently represent a hydrogen atom or an alkyl or aryl group; and X represents a cycloalkylene group having 5 to 10 carbon atoms, an aralkylene group having 7 to 15 carbon atoms, or a haloalkylene group having 1 to 5 carbon atoms.

Examples of the cycloalkylene groups having 5 to 10 carbon atoms represented by X include 1,1-cyclopentylene, 1,1-cyclohexylene, 1,1-(3,3,5-trimethyl)cyclohexylene, norbornan-2,2-diyl, and tricyclo[5.2.1.0.2.6]decan-8,8'-diyl groups. 1,1-cyclohexylene and 1,1-(3,3,5-trimethyl)cyclohexylene groups may be preferably used.

Examples of the aralkylene groups having 7 to 15 carbon atoms represented by X include phenylmethylene, diphenylmethylene, 1,1-(1-phenyl)ethylene, and 9,9-fluorenylene groups.

Preferable examples of the haloalkylene groups having 1 to 5 carbon atoms represented by X include 2,2-hexafluoropropylene, 2,2-(1,1,3,3-tetrafluoro-1,3-dicyclo)propylene groups, and the like.

The structural units of the resin used for the plastic substrate according to the invention may be a single component or a mixture of two or more components. A structural unit other than those above may be contained additionally in an amount in the range that does not impair the advantageous effects of the invention. The content of the other structural units is preferably 50 mol % or less, more preferably 10 mol % or less, in the total structural units. The resin used as the plastic substrate according to the invention may contain a resin other that those described above within the scope of the invention, and may contain two or more resins.

The molecular weight (number-average molecular weight) of the resin used as the plastic substrate according to the invention is preferably 10,000 to 300,000, more preferably 20,000 to 200,000, and still more preferably 30,000 to 150,000 (as polystyrene). In the molecular weight range above, it is possible to improve the mechanical strength of the plastic substrate.

A crosslinking resin may be used preferably as the plastic substrate used as the substrate according to the invention, from the viewpoints of solvent resistance, heat resistance, and others. The crosslinking resin is not particularly limited, and any one of various known resins including thermosetting and radiation-curing resins may be used.

Examples of the thermosetting resins include phenol resins, urea resins, melamine resins, unsaturated polyester resins, epoxy resins, silicone resins, diallyl phthalate resins, furan resins, bismaleimide resins, cyanate resins, and the like.

The crosslinking method is not particularly limited if covalent bonds are formed in the reaction, and systems wherein the reaction occurs at room temperature, such as the urethane bond-forming reaction by using a polyalcohol compound and a polyisocyanate compound, may also be used without any restriction. However, such a system often causes a problem in the pot life before casting, and thus, a two-liquid system in which a polyisocyanate compound is added immediately before casting is normally used. On the other hand, if a one-liquid system is used, the functional groups therein associated with the crosslinking reaction are preferably protected, and such products are commercially available as blocked hardeners. Examples of the commercially available blocked hardeners include block polyisocyanates such as B-882N manufactured by Mitsui Takeda Chemicals Co., Ltd. and Coronate 2513 manufactured by Nippon Polyurethane Industry Co., Ltd.; methylated melamine resins such as Cymer 303 manufactured by Mitsui Cytec Co., Ltd.; and the like. In addition, a blocked polycarboxylic acid represented by the following Formula B-1 is also known as the hardener to epoxy resins.

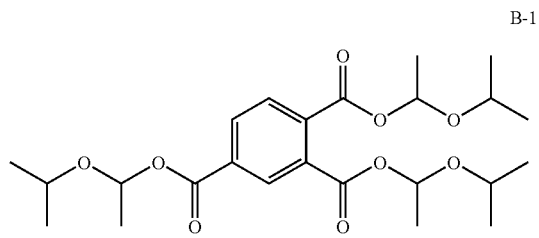

B-1

The radiation-curing resins are grossly grouped into radical curable resins and cation curable resins. Compounds having multiple radical-polymerization groups in the molecule are used as the hardening component in radical curable resin, and examples thereof include compounds called multifunctional acrylate monomers, containing 2 to 6 acrylic ester groups in the molecule, and compounds called urethane acrylates, polyester acrylates, or epoxy acrylates having multiple acrylic ester groups in the molecule.

Typical methods of hardening the radical curable resin include electron beam irradiation and ultraviolet ray irradiation. In the method of ultraviolet ray irradiation, a polymerization initiator, which generates a radical by UV irradiation, is normally added. If a polymerization initiator that generates a radical by heating is added, the resin may be used as a thermosetting resin.

A compound containing multiple cation-polymerization groups in the molecule is used as the hardening component in the cation curable resin, and typically, such a composition is hardened by a method of adding a photochemical acid generator that generates an acid by irradiation of ultraviolet ray and hardening the resin by irradiation of ultraviolet ray. Examples of the cation-polymerization compounds include those containing a ring-opening-polymerization group such as epoxy group and those containing a vinyl ether group.

The thermosetting resins and the radiation-curing resins described above may be used respectively in combination of two or more, and a thermosetting resin and a radiation-curing resin may be used in combination for the plastic substrate. Alternatively, a crosslinkable resin and a polymer having no crosslinkable group may be used as mixed.

Addition of such a crosslinkable resin to the resin for the plastic substrate is preferable, because it is possible to improve all of the solvent resistance, heat resistance, optical properties, and toughness of the plastic substrate obtained. It is also possible to introduce a crosslinkable group into the resin, and the crosslinkable group may be introduced to any region of the polymer, main-chain terminal, branched chain, or main chain. In such a case, the plastic substrate may be prepared from the resin, without using the common crosslinkable resin described above.

The plastic substrate may be stretched previously. The stretching advantageously improves the mechanical strengths such as folding strength and the easiness in handling thereof. In particular, substrates having an orientation release stress (ASTM D1504, hereinafter referred to as ORS) of 0.3 to 3 GPa in the stretching direction are superior in mechanical strength and thus preferable. The ORS is an internal stress generated by stretching that is preserved in the oriented film or sheet. The substrate may be stretched by any one of known methods, for example, at a temperature in the range of 10° C. to 50° C. higher than the glass transition temperature (Tg) of the resin, by a monoaxial roll stretching, monoaxial tenter stretching, simultaneous biaxial stretching, or consecutive biaxial stretching method, or in an inflation-molding process. The stretching ratio is preferably 1.1 to 3.5.

The thickness of the plastic substrate used as the substrate according to the invention is not particularly limited, but preferably 30 to 700 μm, more preferably 40 to 200 μm, and still more preferably 50 to 150 μm.

In any case, haze is preferably 3% or less, more preferably 2% or less, and more preferably 1% or less; and the total light transmittance is preferably 70% or more, more preferably 80% or more, and still more preferably 90% or more. Haze is measured by using a haze meter (e.g., manufactured by Nippon Denshoku), and the total light transmittance by using a visible-ultraviolet absorption spectroscopy.

Resin modifiers such as plasticizer, dye or pigment, antistatic agent, release agent, leveling agent and lubricant may be added to the plastic substrate as needed in an amount in the range that does not impair the advantageous effects of the invention.

The plastic substrate may be optically transparent or non-transparent. When an optically-nontransparent substrate is used as the substrate, an optically reflective white substrate is preferable. Examples of the white substrates include plastic substrates containing an inorganic pigment such as titanium oxide or zinc oxide. To be used as a display screen, the substrate should be transparent at least to visible light.

<Transparent Electrode Layer>

The transparent electrode layer may be formed, for example, with indium oxide, indium tin oxide (ITO), tin oxide, or the like. The transparent electrodes described, for example, in "Liquid Crystal Device Handbook" (Japan Society for Promotion of Science, 142 Committee Ed., Nikkankogyo Shimbun, 1989) p. 232 to 239 are preferably used.

The transparent electrode can be formed, for example, by sputtering, sol-gel method, or printing.

<Field-Effect Transistor Including a Gate Insulator and a Semiconductive Layer Containing an Organic Compound>

The field-effect transistor used in the image display apparatus of the invention has a gate insulator and a semiconductive layer, and additionally a gate electrode, a source electrode, and a drain electrode.

FIG. 1 is a schematic sectional view illustrating the configuration of the field-effect transistor. It is an organic TFT 7 having a gate electrode 2 on a substrate (supporting plate) 1, a gate insulator 3 thereon, a source electrode 4 and a drain electrode 5 formed additionally thereon, and a semiconductive layer 6.

[Semiconductive Layer]

The semiconductive layer 6 includes an organic compound, which is preferably a π-conjugated compound; and examples thereof include polythiophene derivatives, derivatives of polyethylene and polythiophene copolymers, polyfluorene derivatives, polyphenylene derivatives, phthalocyanine derivatives, pentacene derivatives, fullerene derivatives, carbon nanotube derivatives, and the like.

More preferable examples include pentacene derivatives and polythiophene derivatives; and particularly preferable are oligothiophenes, hexyloligothiophenes, pentacene, carbon nanotubes, and the like.

The thickness of the semiconductive layer 6 is preferably 0.01 to 100 µm and more preferably 0.05 to 10 µm. When the semiconductive layer has a thickness smaller than the above range, it may become difficult to control in reducing defects and to obtain preferable semiconductor characteristics. On the other hand, the semiconductive layer having a thickness larger than the above range may lead to increase in cost due to increased amount of the materials used in the semiconductive layer.

The semiconductive layer is preferably prepared by the method of dissolving the organic compound above in a non-aqueous organic solvent and applying and drying the solution.

Examples of the non-aqueous organic solvents include, but are not limited to, chloroform, dichloromethane, toluene, xylene, and the like.

The application methods include spin casting, dipping, dropwise addition, letterpress or intaglio printing, inkjet printing, and the like. The organic compound may be used, as it is mixed with another compound. The compound to be mixed is preferably a polymeric material, and in particular, a semiconductive polymeric material.

[Electrodes]

The electrode used in the gate region, source region, or drain region in the field effect transistor according to the invention is not particularly limited, as far as the material is a conductive material. Examples of the materials include conductive metal oxides such as platinum, gold, silver, nickel, chromium, copper, iron, tin, antimony, lead, tantalum, indium, aluminum, zinc, magnesium, and the alloys thereof, and indium tin oxide; inorganic and organic semiconductors improved in conductivity by doping or the like such as silicon single crystal, polysilicon, amorphous silicon, germanium, graphite, polyacetylene, polypara-phenylene, polythiophene, polypyrrole, polyaniline, polythienylene vinylene, and poly-para-phenylene vinylene; and the complexes thereof; and the like.

In particular among the electrode materials above materials having a smaller electric resistance at the surface in contact with the semiconductive layer are preferable for the electrodes in the source and drain regions.

The method of forming the electrode is not particularly limited. Examples of the methods include dry methods such as vapor deposition and sputtering, wet methods such as coating, printing, and inkjet printing, and the like. The wet methods also include a method of using a solution of electrode materials or a dispersion of the electrode material fine particles in a non-solvent.

[Gate Insulator]

A film having a high dielectric constant and a low conductivity is preferable as the gate insulator. Examples thereof include films of silicon oxide, silicon nitride, aluminum oxide, titanium oxide, tantalum oxide, polyethylene, polyimide, and the like.

The thickness of the gate insulator is preferably 0.01 to 100 µm and more preferably 0.05 to 10 µm.

[Configuration of Field-Effect Transistor]

The channel length of the field-effect transistor according to the invention is preferably 0.01 to 100 µm and more preferably 0.05 to 10 µm. The channel width is preferably 0.01 to 100 mm and more preferably 0.1 to 10 mm.

The electron field-effect mobility of the field-effect transistor according to the invention is preferably $10^{-4}$ to $10^3$ $cm^2/V \cdot sec$ and more preferably $10^{-3}$ to 10 $cm^2 V \cdot sec$.

The on/off ratio is preferably $10^2$ to $10^8$ and more preferably $10^3$ to $10^7$.

A thin-film field-effect transistor is shown in FIG. 1. However, the structure of the field-effect transistor according to the invention is not limited to the thin film shape, and may be three-dimensional, for example cylindrical, in shape.

<Display Layer>

In the invention, a display layer having optical properties that change in response to an electric field is formed on the field-effect transistor. Preferable examples of the display layer having optical properties that change in response to an electric field include electrophoretic display layer, cholesteric liquid crystal display layer, polymer-dispersion liquid crystal display layer, and the like.

[Electrophoretic Display Layer]

The electrophoretic display layer may be a dispersion of colored, charged fine particles dispersed in a microcapsulated dispersion medium, a dispersion of colored, charged fine particles dispersed in a dispersion medium contained in a template formed by embossing, or the like. Multiple kinds of particles different in color and charge from each other may be used in combination. In addition, the dispersion medium may be colored by dissolving a dye into the dispersion medium.

The charged particle may be an inorganic particle such as of silica, alumina, zirconia, titanium oxide, tungsten oxide, zinc oxide, tin oxide, or barium titanate, or an organic particle of a polymer, carbon black, or the like. The charged white particle is preferably titanium oxide, silica gel ($SiO_2$), alumina, or a polymer particle, and the charged black particle is preferably a charged particle of carbon black.

The charged particles are preferably surface-modified, for improvement in dispersion stability in the dispersion medium. The surface-modifying methods include use of a titanium coupling agent (e.g., isopropyl triisostearoyl titanate), a silane-coupling agent (e.g., pentadecafluorodecyltrimethylsilane), or an aluminum coupling agent (e.g., acetoalkoxy aluminum diisopropylate); graft polymerization, and the like. Polyethylene graft polymerization or polystyrene graft polymerization may be used for the graft polymerization of titanium oxide, while graft polymerization using a silanol group for the graft polymerization of silica gel.

Water or a non-aqueous organic solvent may be used as the dispersion medium for dispersing the charged particles. Water and an organic solvent may be used as a mixture. Preferable examples of the non-aqueous organic solvents include hydrocarbons (such as hexane, heptane, pentane, octane, and Isopar (Exxon)), aromatic hydrocarbon compounds (such as benzene, toluene, xylene, mesitylene, ethylbenzene, and alkylnaphthalene), halogenated hydrocarbons (such as difluoropropane, dichloroethane, chloroethane, and bromoethane), halogenated aromatic hydrocarbon compounds (such as chlorobenzene), ether compounds (such as dibutylether, anisole, and diphenylether), alcohol compounds (such as glycerol), carbonyl group-containing compounds (such as propylene carbonate), nitro compounds (such as nitromethane), nitrile compounds (such as acetonitrile and benzonitrile), and the like. The specific densities of the dispersion medium and the charged particle are preferably closer to each other for improvement in dispersion of the charged particles.

The refractive index, specific density, viscosity, resistivity, and dielectric constant of the dispersion medium are preferably adjusted suitably for application as an electronic paper. The adjustment can be performed by mixing multiple solvents. The dispersion medium may contain additionally an acid or alkali, a salt, a dispersion stabilizer, a stabilizer for prevention of oxidation, ultraviolet absorption or the like, an antibacterial, an antiseptic, or the like.

When the display layer is an electrophoretic display layer, the thickness of the electrophoretic display layer is preferably 1 to 100 μm and more preferably 5 to 50 μm.

[Guest-Host Liquid Crystal Display Layer]

The guest-host liquid crystal layer according to the invention displays image by the change in light absorbance of the cell containing a liquid crystal composition of a dichroic dye dissolved in liquid crystal, when the orientation of the dichroic dye varies according to the movement of the liquid crystal under an electric field applied.

The chromophore of the dichroic dye according to the invention will be described below.

In the invention, the chromophore of the dichroic dye is not particularly limited and may be any chromophore, and examples thereof, preferable from the viewpoint of the solubility in the host liquid crystal having a high-order parameter, include azo dyes, anthraquinone dyes, perylene dyes, merocyanine dyes, azomethine dyes, phthaloperylene dyes, indigo dyes, azulene dyes, dioxazine dyes, polythiophene dyes, phenoxazone dyes (such as phenoxazin-3-one), and the like; and typical examples thereof include the dyes described in "Dichroic Dyes for Liquid Crystal Display" (A. V. Ivashchenko, CRC, 1994).

Among them, preferable are azo dyes, anthraquinone dyes, perylene dyes, and phenoxazone dyes; and more preferable are anthraquinone dyes and/or phenoxazone dyes. In particular, it is possible to obtain the advantageous effects of the invention more distinctly, by using one of these dyes having a substituent represented by Formula (2) described below.

More specifically, the dichroic dye according to the invention is preferably has a substituent represented by the following Formula (2).

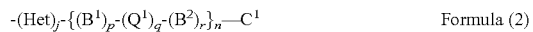

-(Het)$_j$-{(B$^1$)$_p$-(Q$^1$)$_q$-(B$^2$)$_r$}$_n$—C$^1$          Formula (2)

In Formula (2), Het represents an oxygen atom or a sulfur atom, particularly preferably a sulfur atom.

In Formula (2), B$^1$ and B$^2$ each independently represent an arylene, heteroarylene or bivalent cyclic aliphatic hydrocarbon group that may have or may not have a substituent group.

The arylene group represented by B$^1$ or B$^2$ is preferably an arylene group having 6 to 20 carbon atoms, more preferably having 6 to 10 carbon atoms. Typical examples of the preferable arylene groups include phenylene, naphthalene, and anthracene groups. Particularly preferable are substituted phenylene groups, and still more preferable is a 1,4-phenylene group.

The heteroarylene group represented by B$^1$ or B$^2$ is preferably a heteroarylene group having 1 to 20 carbon atoms, more preferably having 1 to 10 carbon atoms. Typical examples of the preferable heteroarylene groups include heteroarylene groups of a pyridine, quinoline, isoquinoline, pyrimidine, pyrazine, thiophene, furan, oxazole, thiazole, imidazole, pyrazole, oxadiazole, thiadiazole or triazole ring, and of a fused ring thereof, from which two hydrogen atoms on the two carbon atoms are removed.

The bivalent cyclic aliphatic hydrocarbon group represented by B$^1$ or B$^2$ is preferably a bivalent cyclic aliphatic hydrocarbon group having 4 to 30 carbon atoms, more preferably having 6 to 20 carbon atoms. Typical examples of the preferable bivalent cyclic aliphatic hydrocarbon groups are cyclohexandiyl and cyclopentandiyl; more preferable are cyclohexan-1,2-diyl, cyclohexan-1,3-diyl, cyclohexan-1,4-diyl, and cyclopentan-1,3-diyl groups; and particularly preferable is a (E)-cyclohexan-1,4-diyl group.

The bivalent arylene group, bivalent heteroarylene group and bivalent cyclic hydrocarbon group represented by B$^1$ or B$^2$ may have a substituent group additionally, and examples of the substituent groups include the substituents in the following group V.

(Substituent Group V)

Halogen atoms (e.g., chlorine, bromine, iodine, and fluorine), a mercapto group, a cyano group, a carboxyl group, a phosphate group, a sulfo group, a hydroxy group, carbamoyl groups having 1 to 10 carbon atoms, preferably having 2 to 8 carbon atoms, and more preferably having 2 to 5 carbon atoms (e.g., methylcarbamoyl, ethylcarbamoyl, and morpholinocarbonyl groups), sulfamoyl groups having 0 to 10 carbon atoms, preferably having 2 to 8 carbon atoms, and more preferably having 2 to 5 carbon atoms (e.g., methylsulfamoyl, ethylsulfamoyl, and pyperidinosulfonyl groups), a nitro group, alkoxy groups having 1 to 20 carbon atoms, preferably having 1 to 10 carbon atoms, and more preferably having 1 to 8 carbon atoms (e.g., methoxy, ethoxy, 2-methoxyethoxy, and 2-phenylethoxy groups), aryloxy groups having 6 to 20 carbon atoms, preferably having 6 to 12 carbon atoms, and more preferably having 6 to 10 carbon atoms (e.g., phenoxy, p-methylphenoxy, p-chlorophenoxy, and naphthoxy groups), acyl groups having 1 to 20 carbon atoms, preferably having 2 to 12 carbon atoms, and more preferably having 2 to 8 carbon atoms (e.g., acetyl, benzoyl, and trichloroacetyl groups), acyloxy groups having 1 to 20 carbon atoms, preferably having 2 to 12 carbon atoms, more preferably having 2 to 8 carbon atoms (e.g., acetyloxy and benzoyloxy groups), acylamino groups having 1 to 20 carbon atoms, preferably having 2 to 12 carbon atoms, and more preferably having 2 to 8 carbon atoms (e.g., acetylamino group), sulfonyl groups having 1 to 20 carbon atoms, preferably having 1 to 10 carbon atoms, and more preferably having 1 to 8 carbon atoms (e.g., methanesulfonyl, ethanesulfonyl, and benzenesulfonyl groups), sulfinyl groups having 1 to 20 carbon atoms, preferably having 1 to 10 carbon atoms, and more preferably having 1 to 8 carbon atoms (e.g., methanesulfinyl, ethanesulfinyl, and benzenesulfinyl groups), and substituted or unsubstituted amino groups having 1 to 20 carbon atoms, preferably having 1 to 12 carbon atoms, and more preferably having 1 to 8 carbon atoms (e.g., amino, methylamino, dimethylamino, benzylamino, anilino, diphenylamino, 4-methylphenylamino, 4-ethylphenylamino, 3-n-propylphenylamino, 4-n-propylphenylamino, 3-n-butylphenylamino, 4-n-butylphenylamino, 3-n-pentylphenylamino, 4-n-pentylphenylamino, 3-trifluoromethylphenylamino, 4-trifluoromethylphenylamino, 2-pyridylamino, 3-pyridylamino, 2-thiazolylamino, 2-oxazolylamino, N,N-methylphenylamino, and N,N-ethylphenylamino groups), ammonium groups having 0 to 15 carbon atoms, preferably having 3 to 10 carbon atoms, and more preferably having 3 to 6 carbon atoms (e.g., trimethylammonium and triethylammonium groups), hydrazino group having 0 to 15 carbon atoms, preferably having 1 to 10 carbon atoms, and more preferably having 1 to 6 carbon atoms (e.g., trimethylhydrazino group), ureido group having 1 to 15 carbon atoms, preferably having 1 to 10 carbon atoms, and more preferably having 1 to 6 carbon atoms (e.g., ureido and N,N-dimethylureido groups), imido groups having 1 to 15 carbon atoms, preferably having 1 to 10 carbon atoms, and more preferably having 1 to 6 carbon atoms (e.g., succinimide group), alkylthio groups having 1 to 20 carbon atoms, preferably having 1 to 12 carbon atoms, and more preferably having 1 to 8 carbon atoms (e.g., methylthio, ethylthio, and propylthio groups), arylthio groups having 6 to 80 carbon atoms, preferably having 6 to 40 carbon atoms, and more preferably having 6 to 30 carbon atoms (e.g., phenylthio, p-methylphenylthio, p-chlorophenylthio, 2-pyridylthio, 1-naphthylthio, 2-naphthylthio, 4-propylcyclohexyl-4'-biphenylthio, 4-butylcyclohexyl-4'-biphenylthio, 4-pentylcyclohexyl-4'-biphenylthio, and 4-propylphenyl-2-ethynyl-4'-biphenylthio groups), heteroarylthio groups having 1 to 80 carbon atoms, preferably having 1 to 40 carbon atoms, and more preferably having 1 to 30 carbon atoms (e.g., 2-pyridylthio, 3-pyridylthio, 4-pyridylthio, 2-quinolylthio, 2-furylthio, and 2-pyrrolylthio groups), alkoxycarbonyl groups having 2 to 20 carbon atoms, preferably having 2 to 12 carbon atoms, and more preferably having 2 to 8 carbon atoms (e.g., methoxycarbonyl, ethoxycarbonyl, and 2-benzyloxycarbonyl groups), aryloxycarbonyl groups having 6 to 20 carbon atoms, preferably having 6 to 12 carbon atoms, and more preferably having 6 to 10 carbon atoms (e.g., phenoxycarbonyl group), unsubstituted alkyl groups having 1 to 18 carbon atoms, preferably having 1 to 10 carbon atoms, and more preferably having 1 to 5 carbon atoms (e.g., methyl, ethyl, propyl, and butyl groups), substituted alkyl groups having 1 to 18 carbon atoms, preferably having 1 to 10 carbon atoms, and more preferably having 1 to 5 carbon atoms (e.g., hydroxymethyl, trifluoromethyl, benzyl, carboxyethyl, ethoxycarbonylmethyl, and acetylaminomethyl groups (wherein unsaturated hydrocarbon groups having 2 to 18 carbon atoms, preferably having 3 to 10 carbon atoms, and more preferably having 3 to 5 carbon atoms (e.g., vinyl, ethynyl, 1-cyclohexenyl, benzylidyne and benzylidene groups) are also included in the substituted alkyl groups), substituted or unsubstituted aryl groups having 6 to 20 carbon atoms, preferably having 6 to 15 carbon atoms, and more preferably having 6 to 10 carbon atoms (e.g., phenyl, naphthyl, p-carboxyphenyl, p-nitrophenyl, 3,5-dichlorophenyl, p-cyanophenyl, m-fluorophenyl, p-toluyl, 4-propylcyclohexyl-4'-biphenyl, 4-butylcyclohexyl-4'-biphenyl, 4-pentylcyclohexyl-4'-biphenyl, and 4-propylphenyl-2-ethynyl-4'-biphenyl groups), and substituted or unsubstituted heteroaryl groups having 1 to 20 carbon atoms, preferably having 2 to 10 carbon atoms, and more preferably having 4 to 6 carbon atoms (e.g., pyridyl, 5-methylpyridyl, thienyl, furyl, morpholino, and tetrahydrofurfuryl groups).

Each group in the substituent group V may form a structure fused with a benzene or naphthalene ring. In addition, the substituent group may be additionally substituted with a group in the substituent group V described above.

Among the groups in the substituent group V, the substituent for the bivalent arylene group, bivalent heteroarylene group and bivalent cyclic hydrocarbon group represented by $B^1$ or $B^2$ is preferably a halogen atom or an alkyl, aryl, alkoxy, aryloxy, amino, substituted amino, hydroxy, alkylthio, or arylthio group described above, and more preferably an alkyl or aryl group or a halogen atom.

In Formula (2), $Q^1$ represents a bivalent connecting group of an atom group containing at least one atom selected from carbon, nitrogen, sulfur and oxygen.

The bivalent connecting group represented by $Q^1$ is a bivalent connecting group preferably having 0 to 60 carbon atoms, more preferably having 0 to 30 carbon atoms, and still more preferably having 0 to 10 carbon atoms.

Preferable examples of the bivalent connecting groups represented by $Q^1$ include alkylene groups, alkenylene groups, alkynylene groups, amido groups, ether groups, ester groups, sulfoamido groups, sulfonic ester groups, ureido groups, sulfonyl groups, sulfinyl groups, thioether groups, carbonyl groups, —NR— groups (wherein, R represents a hydrogen atom or an alkyl or aryl group), azo groups, azoxy groups, and bivalent connecting groups having at least one bivalent heterocyclic group.

The alkylene group represented by $Q^1$ is an alkylene group preferably having 1 to 20 carbon atoms, more preferably having 1 to 10 carbon atoms, and examples thereof include methylene, ethylene, propylene, butylene, pentylene, and cyclohexyl-1,4-diyl groups.

The alkenylene group represented by $Q^1$ is an alkenylene group preferably having 2 to 20 carbon atoms, more preferably having 2 to 10 carbon atoms, and examples thereof include an ethenylene group.

The alkynylene group represented by $Q^1$ is an alkynylene group preferably having 2 to 20 carbon atoms, more preferably having 2 to 10 carbon atoms, and examples thereof include an ethynylene group.

The alkyl group represented by R in the —NR— group is an alkyl group preferably having 1 to 10 carbon atoms, more preferably having 1 to 6 carbon atoms; and the aryl group represented by R is an aryl group preferably having 6 to 20 carbon atoms, more preferably having 6 to 10 carbon atoms.

The heterocyclic ring represented by $Q^1$ is preferably a piperazine group such as piperazin-1,4-diyl group.

The bivalent connecting group represented by $Q^1$ is preferably, an alkylene, alkenylene, alkynylene, ether, thioether, amido, ester, or carbonyl group, or a group in combination of these groups.

The bivalent connecting group represented by $Q^1$ is particularly preferably an alkylene or ester group.

The group $Q^1$ may have a substituent group additionally, and the substituent group is preferably a group in the substituent group V.

In Formula (2), $C^1$ represents an alkyl, cycloalkyl, alkoxy, alkoxycarbonyl, acyl or acyloxy group.

$C^1$ is preferably, an alkyl group or cycloalkyl group having 1 to 30 carbon atoms, more preferably having 1 to 12 carbon atoms, and more preferably having 1 to 8 carbon atoms; an alkoxy group having 1 to 20 carbon atoms, more preferably having 1 to 10 carbon atoms, and more preferably having 1 to 8 carbon atoms; an acyloxy group having 1 to 20 carbon atoms, more preferably having 2 to 12 carbon atoms, and more preferably having 2 to 8 carbon atoms; an acyl group having 1 to 30 carbon atoms, more preferably having 1 to 12 carbon atoms, and more preferably having 1 to 8 carbon atoms; or an alkoxycarbonyl group having 2 to 20 carbon atoms, more preferably having 2 to 12 carbon atoms, and more preferably having 2 to 8 carbon atoms.

The alkyl group, cycloalkyl group, alkoxy group, alkoxycarbonyl group, acyl group or acyloxy group may or may not have a substituent group, and the substituent group is, for example, a group in the substituent group V.

The substituent group on the alkyl group represented by $C^1$ is preferably a halogen atom (fluorine, chlorine, bromine, or iodine), a hydroxy group, an alkoxy group (in particular, methoxy group), or an aryl group (in particular, phenyl group), among the groups in the substituent group V.

The substituent group on the cycloalkyl group represented by $C^1$ is preferably a halogen atom (fluorine, chlorine, bromine, or iodine), a hydroxy group, an alkoxy group (in particular, methoxy group), or an aryl group (in particular, phenyl group), among the groups in the substituent group V.

The substituent group on the alkoxy group represented by $C^1$ is preferably a halogen atom (in particular, fluorine), an alkoxy group (in particular, methoxy or ethoxy group), or an aryl group (in particular, phenyl group), among the groups in the substituent group V.

The substituent group on the alkoxycarbonyl group represented by $C^1$ is preferably a halogen atom (in particular, fluorine) or an alkoxy group (in particular, methoxy group), among the groups in the substituent group V.

The substituent group on the acyl group represented by $C^1$ is preferably a halogen atom (in particular, fluorine) or an alkoxy group (in particular, methoxy group), among the groups in the substituent group V.

The substituent group on the acyloxy group represented by $C^1$ is preferably a halogen atom (in particular, fluorine) or an alkoxy group (in particular, methoxy group), among the groups in the substituent group V.

Typical examples of the alkyl and cycloalkyl groups represented by $C^1$ include methyl, ethyl, propyl, butyl, tert-butyl, i-butyl, s-butyl, pentyl, tert-pentyl, hexyl, heptyl, octyl, cyclohexyl, 4-methylcyclohexyl, 4-ethylcyclohexyl, 4-propylcyclohexyl, 4-butylcyclohexyl, 4-pentylcyclohexyl, hydroxymethyl, trifluoromethyl, and benzyl groups.

Typical examples of the alkoxy groups represented by $C^1$ include methoxy, ethoxy, 2-methoxyethoxy, 2-phenylethoxy, and trifluoromethoxy groups.

Typical examples of the acyloxy groups represented by $C^1$ include acetyloxy and benzoyloxy groups.

Typical examples of the acyl groups represented by $C^1$ include acetyl, formyl, pivaloyl, 2-chloroacetyl, stearoyl, benzoyl, and p-n-octyloxyphenylcarbonyl groups.

Typical examples of the alkoxycarbonyl groups represented by $C^1$ include methoxycarbonyl, ethoxycarbonyl, and 2-benzyloxycarbonyl groups.

$C^1$ particularly preferably represents an alkyl or alkoxy group, and more preferably an ethyl, propyl, butyl, pentyl, hexyl, or trifluoromethoxy group.

j is 0 or 1, preferably 0.

Each of p, q, and r is independently an integer of 0 to 5; and n is an integer of 1 to 3. The total number of the groups represented by $B^1$ and $B^2$, i.e., $(p+r) \times n$, is an integer of 3 to 10, and is more preferably an integer of 3 to 6. When p, q or r is 2 or more, the two or more groups of $B^1$, $Q^1$ or $B^2$ may be the same as or different from each other; and when n is 2 or more, the two or more groups $\{(B^1)_p\text{-}(Q^1)_q\text{-}(B^2)_r\}$ may be the same as or different from each other.

Preferable combination of p, q, r and n will be listed below.
(i) p=3, q=0, r=0, and n=1
(ii) p=4, q=0, r=0, and n=1
(iii) p=5, q=0, r=0, and n=1
(iv) p=2, q=0, r=1, and n=1
(v) p=2, q=1, r=1, and n=1
(vi) p=1, q=1, r=2, and n=1
(vii) p=3, q=1, r=1, and n=1
(viii) p=2, q=0, r=2, and n=1
(ix) p=1, q=1, r=1, and n=2
(x) p=2, q=1, r=1, and n=2

Particularly preferable are the following combinations:
(i) p=3, q=0, r=0, and n=1;
(iv) p=2, q=0, r=1, and n=1; and
(v) p=2, q=1, r=1, and n=1.

In addition, $-\{(B^1)_p\text{-}(Q^1)_q\text{-}(B^1)_r\}_n\text{-}C^1$ preferably contains a partial structure showing liquid crystallinity. The liquid crystal may be in any phase, but is preferably nematic liquid crystal, smectic liquid crystal, or discotic liquid crystal, and particularly preferably nematic liquid crystal.

Typical examples of $-\{(B^1)_p\text{-}(Q^1)_q\text{-}(B^2)_r\}_n\text{-}C^1$ are shown below, but the invention is not limited thereto (the wavy line in the Figure indicates the connecting position).

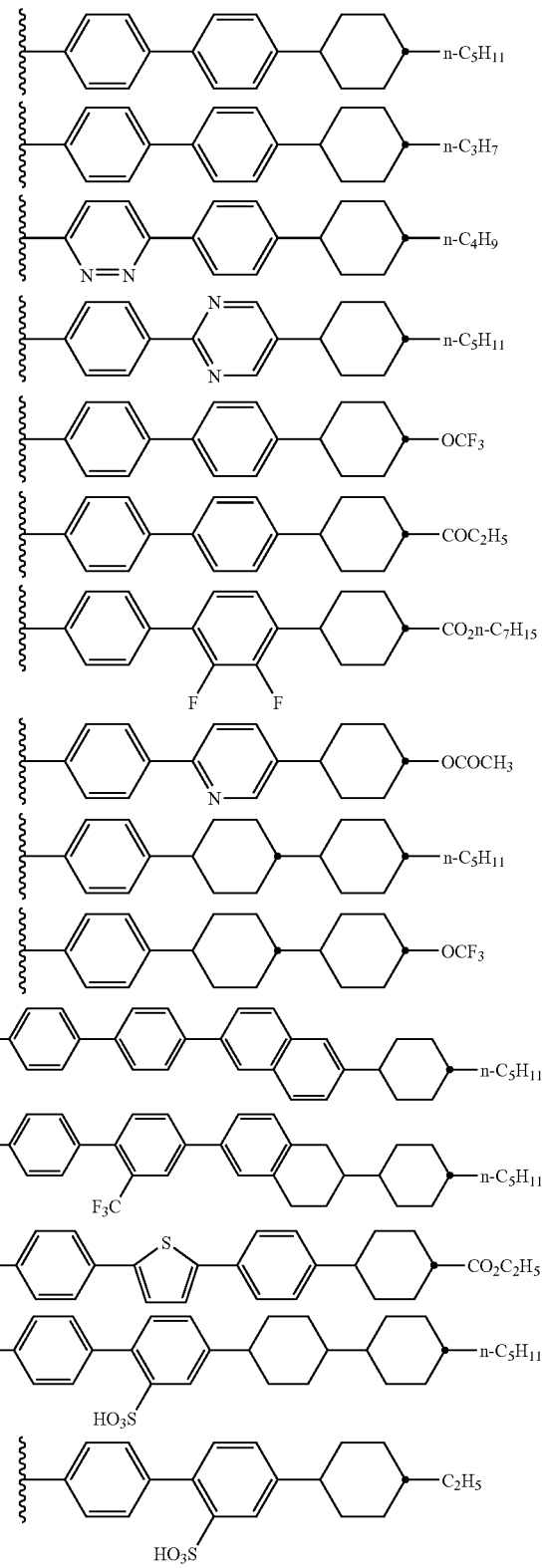

The dichroic dye used in the invention preferably has one or more substituent groups represented by $-\{(B^1)_p\text{-}(Q^1)_q\text{-}(B^2)_r\}_n\text{-}C^1$, more preferably 1 to 8 groups, still more preferably 1 to 4 groups, and particularly preferably 1 or 2 groups.

Preferable structures of the substituent groups represented by Formula (2) above include the followings.

(1) Het is a sulfur atom; $B^1$ is an aryl or heteroaryl group; $B^2$ is a cyclohexan-1,1-diyl group; $C^1$ is an alkyl group; and j=1, p=2, q=0, r=1 and n=1.

(2) Het is a sulfur atom; $B^1$ is an aryl or heteroaryl group; $B^2$ is a cyclohexan-1,1-diyl group; $C^1$ is an alkyl group; and j=1, p=1, q=0, r=2 and n=1.

Particularly preferable structures are:

(I) a structure represented by the following Formula (a-1), wherein Het is a sulfur atom; $B^1$ is a 1,4-phenylene group; $B^2$ is trans-cyclohexyl group; $C^1$ is an alkyl group (preferably methyl, ethyl, propyl, butyl, pentyl or hexyl group); and j=1, p=2, q=0, r=1 and n=1; and (2) a structure represented by the following Formula (a-2), wherein Het is a sulfur atom; $B^1$ is a 1,4-phenylene group; $B^2$ is a trans-cyclohexan-1,1-diyl group; $C^1$ is an alkyl group (preferably methyl, ethyl, propyl, butyl, pentyl or hexyl group); and j=1, p=1, q=0, r=2 and n=1.

Formula (a-1)

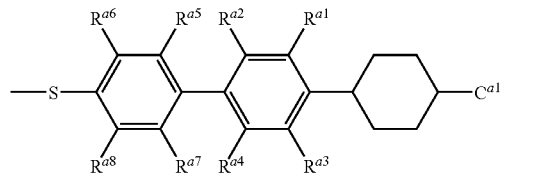

Formula (a-2)

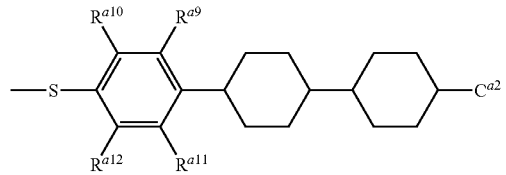

In the Formulae (a-1) and (a-2), $R^{a1}$ to $R^{a12}$ each independently represent a hydrogen atom or a substituent group. Examples of the substituent groups include substituent groups selected from those in the substituent group V described above.

$R^{a1}$ to $R^{a12}$ each preferably, independently represent a hydrogen atom, a halogen atom (in particular, fluorine atom), or an alkyl, aryl, or alkoxy group. Preferable examples of the alkyl, aryl, and alkoxy groups represented by $R^{a1}$ to $R^{a12}$ are the same as the alkyl, aryl, and alkoxy groups described in the substituent group V described above.

In Formulae (a-1) and (a-2) above, $C^{a1}$ and $C^{a2}$ each independently represent an alkyl group, preferably an alkyl group having 1 to 20 carbon atoms, more preferably an alkyl group having 1 to 10 carbon atoms, and particularly preferably a methyl, ethyl, propyl, butyl, pentyl or hexyl group.

The azo dye may be any dye such as monoazo dye, bisazo dye, trisazo dye, tetrakisazo dye, or pentakisazo dye, but is preferably a monoazo dye, a bisazo dye, or a trisazo dye.

The ring structure in the azo dye may be an aromatic ring (benzene, naphthalene, or the like) or a hetero ring (quinoline, pyridine, thiazole, benzothiazole, oxazole, benzoxazole, imidazole, benzimidazole, pyrimidine, or the like).

The substituent group on the anthraquinone dye is preferably a group containing an oxygen, sulfur or nitrogen atom, and examples thereof include alkoxy, aryloxy, alkylthio, arylthio, alkyl amino, and aryl amino groups.

The number of the substituents in the substituent group is not limited; disubstituted, trisubstituted, and tetrakissubstituted groups are preferably; and disubstituted and trisubstituted groups are particularly preferable. The substitution sites of the substituent groups are not limited; but preferable are 1,4-disubstituted, 1,5-disubstituted, 1,4,5-trisubstituted, 1,2,4-trisubstituted, 1,2,5-trisubstituted, 1,2,4,5-tetrasubstituted, and 1,2,5,6-tetrasubstituted structures.

The anthraquinone dye is more preferably a compound represented by the following Formula (3).

Formula (3)

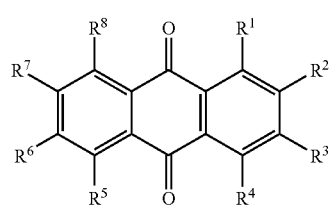

In Formula (3), at least one of $R^1, R^2, R^3, R^4, R^5, R^6, R^7$ and $R^8$ represents -(Het)$_j$-{$(B^1)_p$-$(Q^1)_q$-$(B^2)_r$}$_n$—$C^1$; and the other groups each independently represent a hydrogen atom or a substituent group.

In -(Het)$_j$-{$(B^1)_p$-$(Q^1)_q$-$(B^2)_r$}$_n$—$C^1$, Het represents an oxygen or sulfur atom; $B^1$ and $B^2$ each independently represent an arylene, heteroarylene or bivalent cyclic aliphatic hydrocarbon group; $Q^1$ represents a bivalent connecting group; $C^1$ represents an alkyl, cycloalkyl, alkoxy, alkoxycarbonyl, acyl or acyloxy group; j is 0 or 1; each of p, q and r is an integer of 0 to 5; and n is an integer of 1 to 3. (p+r)×n is an integer of 3 to 10, more preferably an integer of 3 to 6. When p, q or r is 2 or more, the two or more groups of $B^1$, $Q^1$ or $B^2$ may be the same as or different from each other; and when n is 2 or more, the two or more groups {$(B^1)_p$-$(Q^1)_q$-$(B^2)_r$} may be the same as or different from each other.

Preferable examples of Het, $B^1$, $B^2$, $Q^1$, $C^1$, j, p, q, r, and n are respectively the same as those of the Het, $B^1$, $B^2$, $Q^1$, $C^1$, j, p, q, r, and n described in Formula (2) above.

In Formula (3), each of the substituent groups represented by $R^3, R^3, R^4, R^5, R^6, R^7$ and $R^8$ is a group in the substituent group V; but preferably, an arylthio group having 6 to 80 carbon atoms, more preferably having 6 to 40 carbon atoms, and still more preferably having 6 to 30 carbon atoms (e.g., phenylthio, p-methylphenylthio, p-chlorophenylthio, 4-methylphenylthio, 4-ethylphenylthio, 4-n-propylphenylthio, 2-n-butylphenylthio, 3-n-butylphenylthio, 4-n-butylphenylthio, 2-t-butylphenylthio, 3-t-butylphenylthio, 4-t-butylphenylthio, 3-n-pentylphenylthio, 4-n-pentylphenylthio, 4-amylpentylphenylthio, 4-hexylphenylthio, 4-heptylphenylthio, 4-octylphenylthio, 4-trifluoromethylphenylthio, 3-trifluoromethylphenylthio, 2-pyridylthio, 1-naphthylthio, 2-naphthylthio, 4-propylcyclohexyl-4'-biphenylthio, 4-butylcyclohexyl-4'-biphenylthio, 4-pentylcyclohexyl-4'-biphenylthio, or 4-propylphenyl-2-ethynyl-4'-biphenylthio), a heteroarylthio group having 1 to 80 carbon atoms, more preferably having 1 to 40 carbon atoms, and still more preferably having 1 to 30 carbon atoms (e.g., 2-pyridylthio, 3-pyridylthio, 4-pyridylthio, 2-quinolylthio, 2-furylthio, or 2-pyrrolylthio), a substituted or unsubstituted alkylthio group (e.g., methylthio, ethylthio, butylthio, or phenethylthio), a substituted or unsubstituted amino group (e.g., amino, methylamino, dimethylamino, benzylamino, anilino, diphenylamino, 4-methylphenylamino, 4-ethylphenylamino, 3-n-propylphenylamino, 4-n-propylphenylamino, 3-n-butylphenylamino, 4-n-butylphenylamino, 3-n-pentylphenylamino, 4-n-pentylphenylamino, 3-trifluoromethylphenylamino, 4-trifluoromethylphenylamino, 2-pyridylamino, 3-pyridylamino, 2-thiazolylamino, 2-oxazolylamino, N,N-methylphenylamino, or N,N-ethylphenylamino), a halogen atom (e.g., fluorine or chlorine atom), a substituted or unsubstituted alkyl group (e.g., methyl or trifluoromethyl), a substituted or unsubstituted alkoxy group (e.g., methoxy or trifluoromethoxy), a substituted or unsubstituted aryl group (e.g., phenyl), a substituted or unsubstituted heteroaryl group (e.g., 2-pyridyl), a substituted or unsubstituted aryloxy group (e.g., phenoxy), a substituted or unsubstituted heteroaryloxy group (e.g., 3-thienyloxy), or the like.

Each of $R^2$, $R^3$, $R^4$, $R^5$, $R^6$, $R^7$ and $R^8$ is preferably, a hydrogen, fluorine, or chlorine atom, or a substituted or unsubstituted arylthio, alkylthio, amino, alkylamino, arylamino, alkyl, aryl, alkoxy or aryloxy group, and particularly preferably a hydrogen or fluorine atom, or a substituted or unsubstituted arylthio, alkylthio, amino, alkylamino or arylamino group.

More preferably in Formula (3), at least one group of $R^1$, $R^4$, $R^5$, and $R^8$ is -(Het)$_j$-{(B$^1$)$_p$-(Q$^1$)$_q$-(B$^2$)$_r$}$_n$—C$^1$.

The substituent group on the phenoxazone dye (phenoxazin-3-one) is preferably a group containing an oxygen, sulfur or nitrogen atom, and preferable examples thereof include alkoxy, aryloxy, alkylthio, arylthio, alkylamino, and arylamino groups.

The phenoxazone dye is more preferably a compound represented by the following Formula (4).

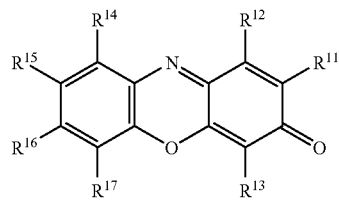

Formula (4)

In Formula (4), at least one of $R^{11}$, $R^{12}$, $R^{13}$, $R^{14}$, $R^{15}$, $R^{16}$ and $R^{17}$ is -(Het)$_j$-{(B$^1$)$_p$-(Q$^1$)$_q$-(B$^2$)$_r$}$_n$—C$^1$; and each of the other groups is a hydrogen atom or a substituent group.

In -(Het)$_j$-{(B$^1$)$_p$-(Q$^1$)$_q$-(B$^2$)$_r$}$_n$—C$^1$, Het represents an oxygen or sulfur atom; B$^1$ and B$^2$ each independently represent an arylene, heteroarylene or bivalent cyclic aliphatic hydrocarbon group; Q$^1$ represents a bivalent connecting group; C$^1$ represents an alkyl, cycloalkyl, alkoxy, alkoxycarbonyl, acyl or acyloxy group; j is 0 or 1; each of p, q and r is an integer of 0 to 5; and n is an integer of 1 to 3. (p+r)×n is an integer of 3 to 10, more preferably an integer of 3 to 6. When p, q or r is 2 or more, the two or more groups of B$^1$, Q$^1$ or B$^2$ may be the same as or different from each other; and when n is 2 or more, the two or more groups {(B$^1$)$_p$-(Q$^1$)$_q$-(B$^2$)$_r$} may be the same as or different from each other.

Preferable examples of the B$^1$, B$^2$, Q$^1$, C$^1$, p, q, r, and n are respectively the same as those of the B$^1$, B$^2$, Q$^1$, C$^1$, p, q, r, and n described in Formula (2) above.

In Formula (4), examples of the substituent groups represented by $R^{11}$, $R^{12}$, $R^{13}$, $R^{14}$, $R^{15}$, $R^{16}$ and $R^{17}$ include halogen atoms, and alkyl, aryl, alkylthio, arylthio, heterocyclic thio, hydroxyl, alkoxy, aryloxy, carbamoyl, acyl, aryloxycarbonyl, alkoxycarbonyl, and amido groups, and particularly preferably a hydrogen atom, a halogen atom, alkyl groups, arylthio groups, and amido groups.

$R^{16}$ is preferably an amino group (or an alkylamino or arylamino group), a hydroxyl group, a mercapto group, an alkylthio group, an arylthio group, an alkoxy group or an aryloxy group, and particularly preferably an amino group.

Still more preferably in Formula (4), at least one of $R^{11}$, $R^{14}$, and $R^{16}$ is -(Het)$_j$-{(B$^1$)$_p$-(Q$^1$)$_q$-(B$^2$)$_r$}$_n$—C$^1$.

Typical examples of the dichroic anthraquinone dyes and/or the phenoxazone dyes used in the invention will be listed below, but the invention is not restricted by the following typical examples.

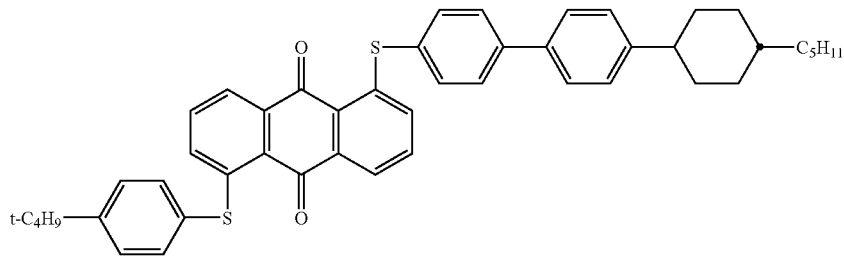

No. 1-1

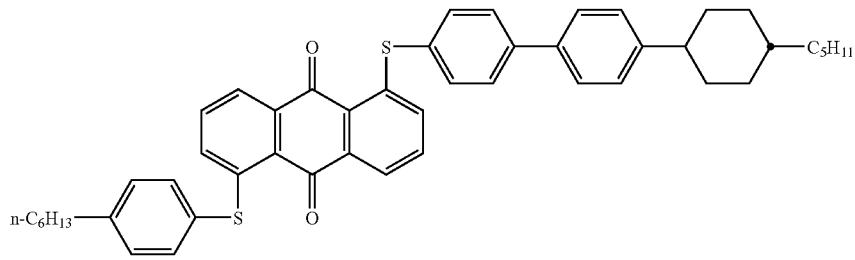

No. 1-2

-continued
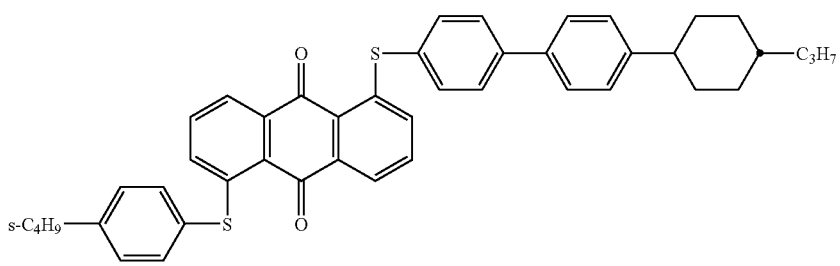
No. 1-3
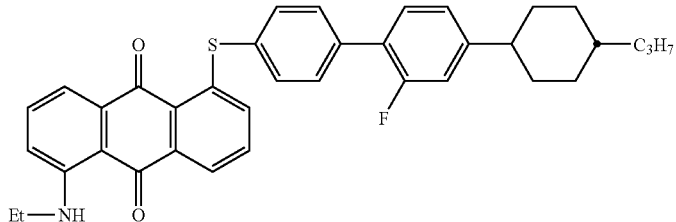
No. 1-4
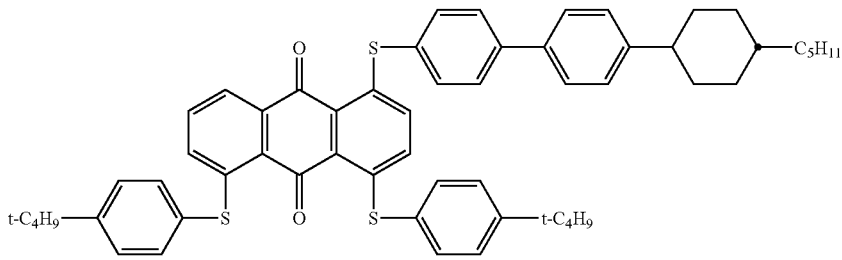
No. 1-5
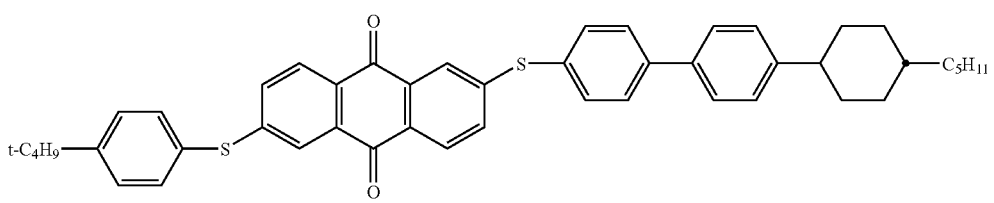
No. 1-6
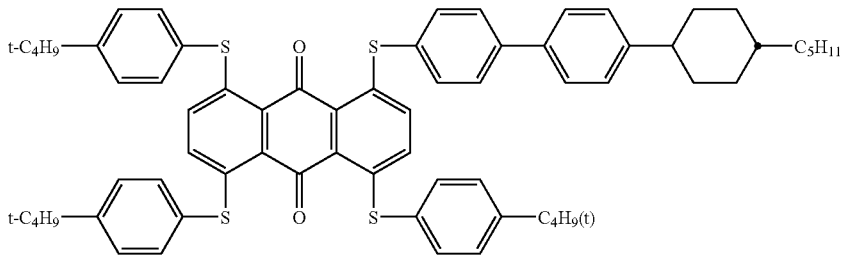
No. 1-7
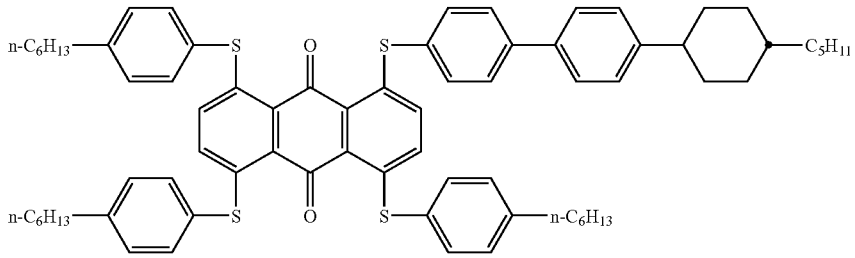
No. 1-8

-continued
No. 1-9
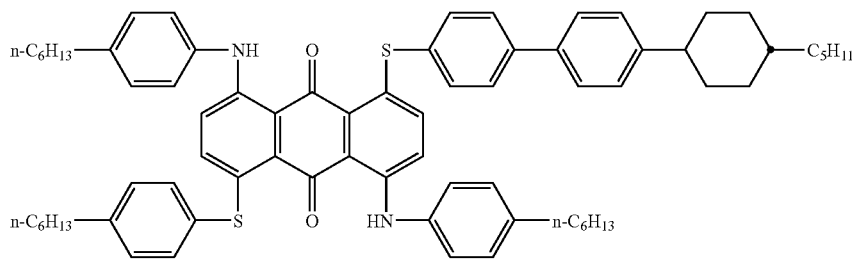
No. 1-10
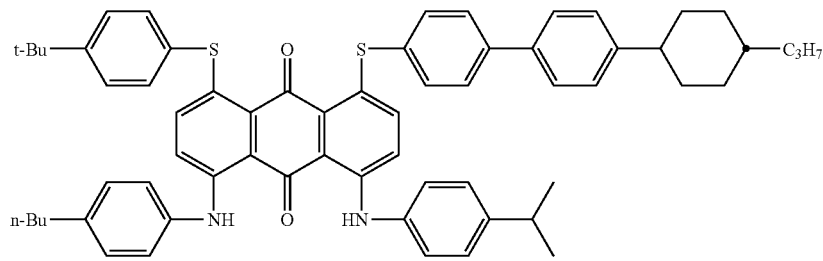
No. 1-11
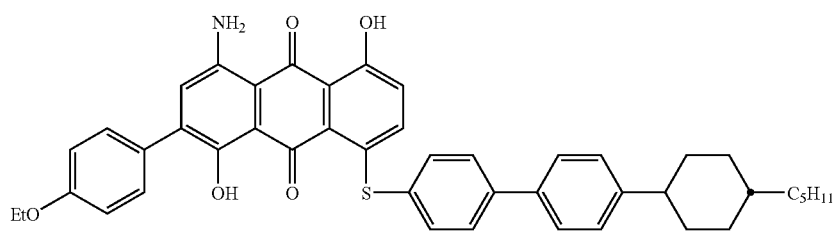
No. 1-12
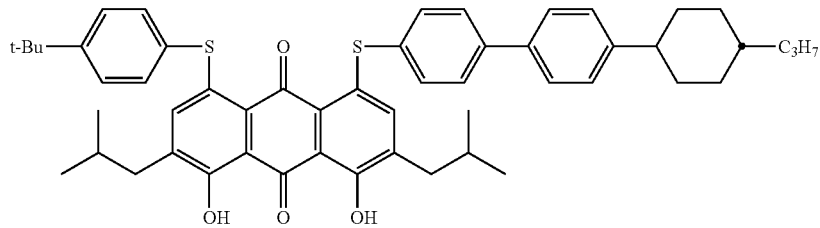
No. 1-13
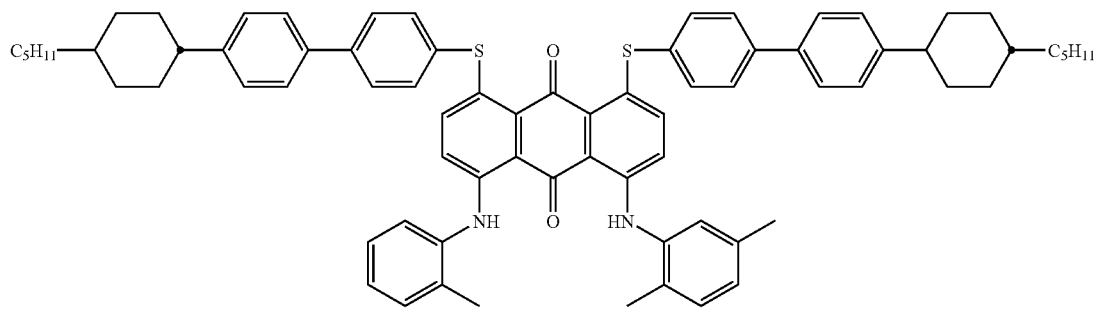
No. 1-14
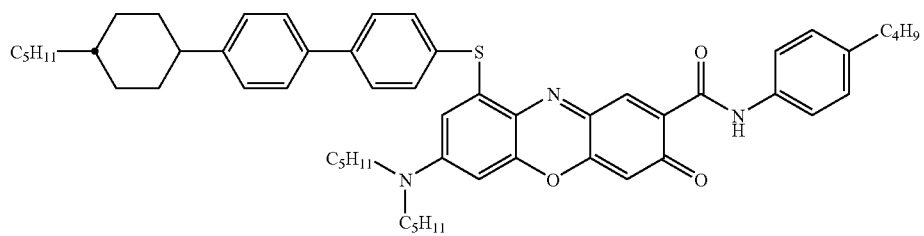

No. 1-15
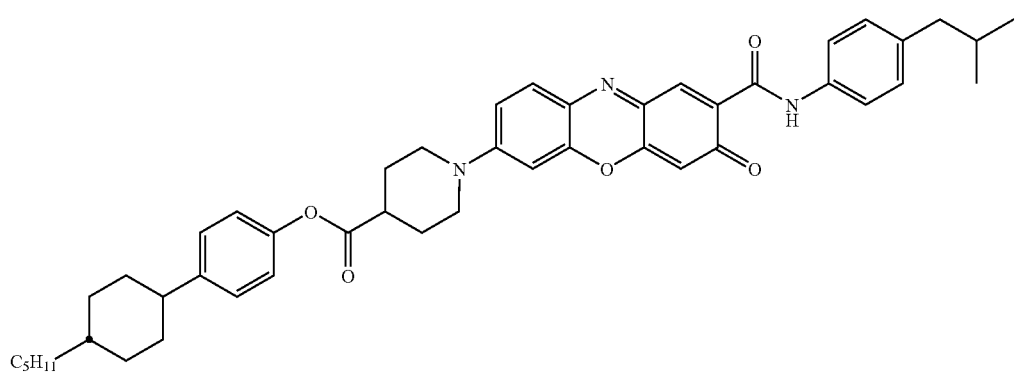
No. 1-16
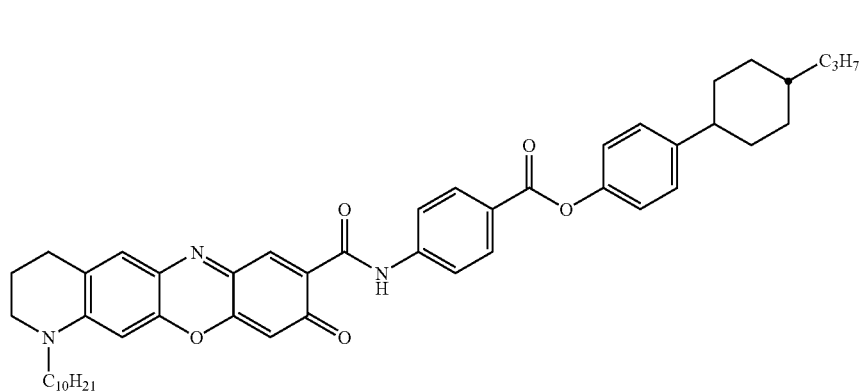
No. 1-17
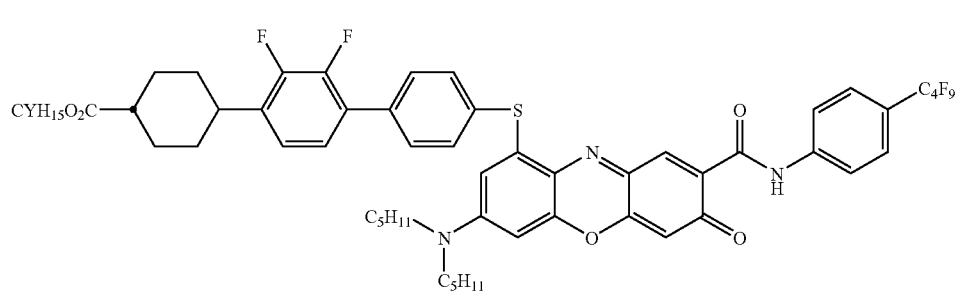
Typical examples of the dichroic azo dyes used in the invention will be listed below, but the invention is not restricted by the following typical examples.
No. 2-1
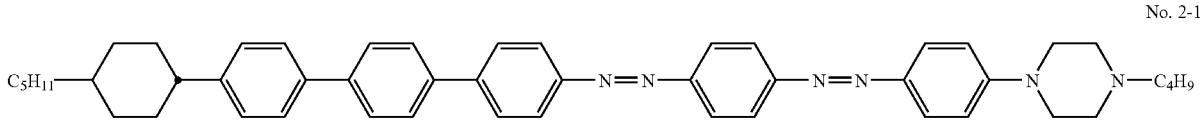
No. 2-2
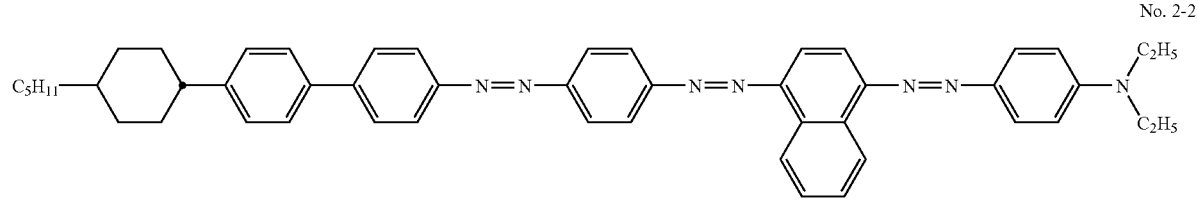

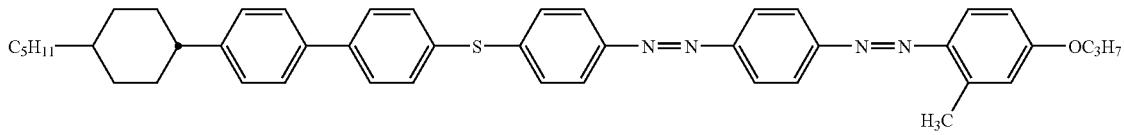

No. 2-3

Typical examples of the dichroic dioxazine and merocyanine dyes used in the invention will be listed below, but the invention is not restricted by the following typical examples.

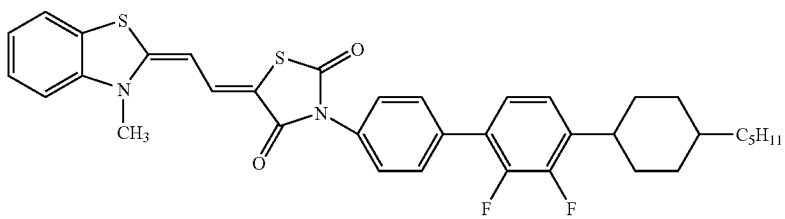

No. 3-1

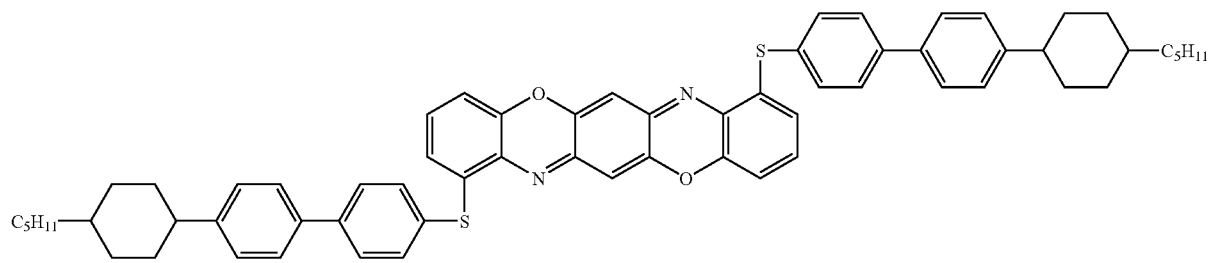

No. 3-2

The substituted dichroic dye represented by Formula (2) can be prepared by any combination of known methods. For example, it may be prepared according to the method described, for example, in JP-A No. 2003-192664.

The host liquid crystal used in the liquid crystal composition according to the invention is not particularly limited, if it can be present together with the compound according to the invention; and, for example, liquid crystal compounds in the nematic or smectic phase can be used. Typical examples thereof include azomethine compounds, cyanobiphenyl compounds, cyanophenyl esters, fluorine-substituted phenyl esters, phenyl cyclohexanecarboxylate esters, fluorine-substituted phenyl cyclohexanecarboxylate esters, cyanophenylcyclohexane, fluorine-substituted phenylcyclohexanes, cyanosubstituted phenylpyrimidines, fluorine-substituted phenylpyrimidines, alkoxy-substituted phenylpyrimidines, fluorine-substituted alkoxy-substituted phenylpyrimidines, phenyldioxane, tolan compounds, fluorine-substituted tolan compounds, alkenylcyclohexylbenzonitriles, and the like.

The liquid crystal compounds described in "Liquid Crystal Device Handbook" (Japan Society for the Promotion of Science, 142 Committee Ed., Nikkankogyo Shimbun, 1989) p. 154 to 192 and p. 715 to 722 can also be used. A fluorine-substituted host liquid crystal suitable for TFT driving may also be used. Examples thereof include liquid crystals manufactured by Merck (ZLI-4692, MLC-6267, 6284, 6287, 6288, 6406, 6422, 6423, 6425, 6435, 6437, 7700, 7800, 9000, 9100, 9200, 9300, and 10000, and the like), and liquid crystals manufactured by Chisso Corporation (LIXON 5036xx, 5037xx, 5039xx, 5040xx, and 5041xx, and the like).

The dielectric anisotropy of the host liquid crystal used in the invention may be positive or negative. When a host liquid crystal having positive dielectric anisotropy is oriented in the horizontal direction, the liquid crystal absorbs light, because it is oriented horizontally when no voltage is applied. On the other hand, when a voltage is applied, the dichroic dye is oriented vertically because the liquid crystal molecules orient themselves vertically, and allows transmission of light. Thus, the system is in the mode of displaying white when voltage is applied and displaying black when no voltage is applied. When a host liquid crystal having negative dielectric anisotropy is oriented in the vertical direction, the dichroic dye is oriented vertically because the liquid crystal orients itself vertically when no voltage is applied, and allows permeation of the light without absorption. On the other hand, when a voltage is applied the dichroic dye is oriented horizontally because the liquid crystal molecules also orient themselves horizontally, and, as a result, absorbs light. The system is in the mode of displaying white when no voltage is applied and displaying black when voltage is applied. The liquid crystal having negative dielectric anisotropy should have a structure higher in dielectric anisotropy in the direction of the minor axis of liquid crystal molecule, and examples of such liquid crystals include those described in "Monthly Display" (2000, April) p. 4 to 9 and Synlett., No. 4, p. 389 to 396, 1999. In particular, liquid crystals having negative dielectric anisotropy containing a fluorine-based substituent are preferable, from the viewpoint of the voltage retention rate. Examples thereof include liquid crystals manufactured by Merck (MLC-6608, 6609, and 6610, and the like).

Alternatively, a two-frequency driving liquid crystal may be used as the guest-host liquid crystal according to the invention. Use of a two-wavelength driving liquid crystal in the image display apparatus according to the invention is effective in increasing the response speed. The two-frequency driving liquid crystal is a liquid crystal that shows positive dielectric anisotropy when the frequency of the electric field applied to the liquid crystal is in a low frequency region and negative anisotropy when it is in a high frequency region. Such liquid crystals are described in detail in Liquid Crystal Device Handbook, Japan Society for the Promotion of Science, 142 Committee Ed., Nikkankogyo Shimbun, 1989, p. 189 to 192. A typical example thereof is the two-frequency driving liquid crystal manufactured by Eastman Kodak shown below.

Two-Frequency Driving Liquid Crystal 1

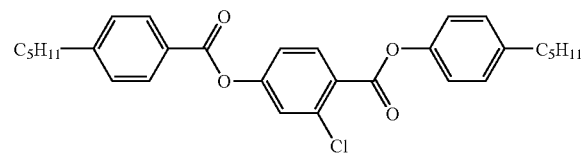

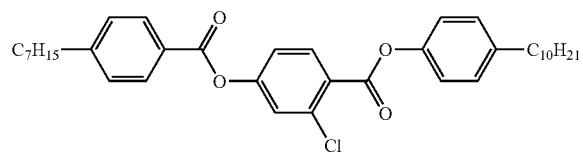

Other commercially available two-frequency driving liquid crystal materials include DF-02XX, DF-05XX, FX-1001 and FX-1002 manufactured by Chisso Corporation, MLC-2048 manufactured by Merck, and others.

The two-frequency driving liquid crystal used in the invention may be a mixture of multiple liquid crystal compounds. Further, a liquid crystal compound that does not show reversal of the dielectric anisotropy between the low and high frequency regions of the electric field applied may be contained.

The preferable range of the voltage applied to the liquid crystal layer may vary according to the kind of the liquid crystal composition used, the crossover frequency of the liquid crystal composition used, and the like; but the frequency region of the electric field applied to the liquid crystal composition is generally, preferably 0.1 Hz to 10 MHz, more preferably 1 Hz to 1 MHz.

When a two-frequency driving liquid crystal is used, both voltages at low- and high-frequency regions are applied. The low-frequency region is generally, preferably 0.1 Hz to 100 kHz, more preferably 1 Hz to 10 kHz, and still more preferably 10 Hz to 10 kHz. The high-frequency region is generally, preferably 100 Hz to 10 MHz, more preferably 100 Hz to 1 MHz, and still more preferably 1 kHz to 1 MHz.

In the invention, a compound showing no liquid crystallinity may be added for adjusting the physical properties of the host liquid crystal in the a desirable range (e.g., for adjusting the temperature of the liquid crystalline phase in a preferable temperature range). In addition, a compound such as chiral compound, ultraviolet absorber, antioxidant, or the like may also be added. Such additives include, for example, the chiral agents for TN and STN liquid crystals described in "Liquid Crystal Device Handbook" (Japan Society for the Promotion of Science, 142 Committee Ed., Nikkankogyo Shimbun, 1989), p. 199 to 202. In a preferable embodiment of the invention, a chiral nematic liquid crystalline phase containing a chiral compound is used. Examples of the chiral compounds include R-811, S-811, R-1082, S-1082, and others manufactured by Merck. The content of the chiral compound is preferably 0.01 to 15 mass % and particularly preferably 0.5 to 6 mass %.

The contents of the host liquid crystal and dichroic dye in the liquid crystal element according to the invention are not particularly limited, but the content of the dichroic dye is preferably 0.1 to 15 mass %, particularly preferably, 0.5 to 6 mass %, with respect to the content of the host liquid crystal.

The contents of the host liquid crystal and the dichroic dye are preferably determined, by preparing a liquid crystal composition containing both compounds, measuring the absorption spectrum of the liquid crystal cell containing the enclosed liquid crystal composition, and determining the dye concentration needed for giving the liquid crystal cell with a desired optical density.

When the display layer is a guest-host liquid crystal display layer, the thickness of the guest-host liquid crystal display layer is preferably 1 to 100 μm and more preferably 4 to 40 μm.

<Layer Containing Fluorescent Brightener>

The fluorescent brightener according to the invention preferably contains a compound that absorbs light having a wavelength of 200 to 410 nm and emitting light having a wavelength of approximately 410 to approximately 500 nm. The fluorescent brightener provides white reflected light as a result of providing blue light having a wavelength of approximately 410 to 500 nm by emission in addition to its inherent yellow reflected light. The reflected light becomes even whiter because of the increase in the energy of visible light by the fluorescence effect.

Light in the visible range is permeated for display in the image display apparatus according to the invention. Therefore, the fluorescent brightener preferably absorbs little light in the visible range used for displaying (light having a wavelength of 410 nm to 800 nm). It is particularly efficient for image display to employ a fluorescent brightener that absorbs light having a wavelength shorter than the minimum wavelength in the visible range, i.e., a wavelength of 410 nm or less, and emits light having a wavelength of 410 nm or more.

The layer containing the fluorescent brightener used in the invention is not particularly limited, as far as the layer absorbs, or cuts, 90% or more of light having a wavelength of 200 nm or more and 410 nm or less. The layer preferably contains a transparent resin component and a fluorescent brightener.

The light absorbance is determined by visible-ultraviolet absorption spectroscopy.

Examples of the transparent resin component in the fluorescent brightener-containing layer include acrylic resins, urethane resins, aminoalkyd resins, epoxy resins, silica resins, fluoroplastics, and the like. These resins may contain a major agent, hardener, diluent, leveling agent, cissing inhibitor, and others at an arbitrary ratio.

When an acrylic urethane resin or a silicon acrylic resin is used as the transparent resin component, the hardener is, for example, a polyisocyanate; and the diluent is, for example, a hydrocarbon solvent such as toluene or xylene, an ester solvent such as isobutyl acetate, butyl acetate, or amyl acetate, or an alcohol solvent such as isopropyl alcohol or butyl alcohol.

Typical examples of the transparent resin component include polymethyl methacrylate, polymethyl methacrylate styrene copolymers, polyvinyl chloride, polyvinyl acetate, and the like. The acrylic urethane resins are acrylic urethane resins obtained in reaction of a copolymer of a methacrylic ester (typically, methyl) and a hydroxyethyl methacrylate copolymer with a polyisocyanate. Examples of the polyisocyanates include tolylene diisocyanate, diphenylmethane diisocyanate, polymethylene polyphenylene polyisocyanate, toluidine diisocyanate, naphthalene diisocyanate, hexamethylene diisocyanate, isophorone diisocyanate, xylylene diisocyanate, dicyclohexylmethane diisocyanate, hexamethylene diisocyanate, and the like.

In addition to these components, a leveling agent such as acrylic resin or silicone resin, a cissing inhibitor such as silicone or acrylic resin, and others may be added.

The fluorescent brightener used in the invention may be selected from commercially available products or the compounds represented by the following Formula (1), according to their light stability and the like.

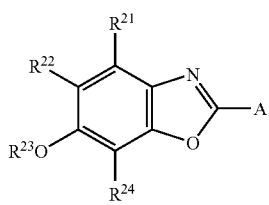

Formula (1)

In Formula (1), $R^{21}$ and $R^{24}$ each independently represent a hydrogen atom or an alkyl or alkoxy group; and $R^{22}$ and $R^{23}$ each represent an alkyl group. A represents a substituted aryl or ethenyl group.

$R^{21}$, $R^{22}$, $R^{23}$, $R^{24}$ and A in Formula (1) of the invention will be described below in detail.

$R^{21}$ and $R^{24}$ each independently represent a hydrogen atom, an alkyl group or an alkoxy group, preferably a hydrogen atom, an alkyl group having 1 to 8 carbon atoms, or an alkoxy group having 1 to 8 carbon atoms.

More specifically, it is preferable that $R^{21}$ and $R^{24}$ each independently represent a hydrogen atom, an alkyl group such as methyl, ethyl, n-propyl, n-butyl, n-octyl, isopropyl, isobutyl, 2-ethylhexyl, t-butyl, t-amyl, t-octyl, cyclopentyl or cyclohexyl, or an alkoxy group such as methoxy, ethoxy, n-propoxy, n-butoxy, n-octyloxy, isopropoxy, isobutoxy, 2-ethylhexyloxy, t-butoxy or cyclohexyloxy.

Each of $R^{21}$ and $R^{24}$ is preferably a hydrogen atom or an alkyl group, and particularly preferably a hydrogen atom.

$R^{22}$ and $R^{23}$ each independently represent an alkyl group, preferably an alkyl group having 1 to 16 carbon atoms, and more preferably an alkyl group having 1 to 10 carbon atoms, more specifically an alkyl group such as methyl, ethyl, n-propyl, n-butyl, n-octyl, n-hexadecanyl (cetyl), isopropyl, isobutyl, 2-ethylhexyl, t-butyl, t-amyl, t-octyl, cyclopentyl or cyclohexyl.

Preferably, $R^{22}$ is a methyl group or a secondary or tertiary alkyl group having 1 to 10 carbon atoms, more preferably a methyl, isopropyl, t-butyl or cyclohexyl group, and still more preferably a t-butyl or cyclohexyl group.

$R^{23}$ is preferably a methyl, ethyl, n-propyl, n-butyl, n-pentyl, n-hexyl or 2-ethylhexyl group, and more preferably a methyl, n-butyl, n-octyl or 2-ethylhexyl group.

A represents a substituted aryl group or a substituted ethenyl group, more preferably a substituted aryl group having 6 to 40 carbon atoms or a substituted ethenyl group having 8 to 40 carbon atoms, and still more preferably a substituted aryl group having 6 to 12 carbon atoms or a substituted ethenyl group having 8 to 20 carbon atoms. A is preferably represented by one of the substituted aryl or ethenyl groups shown below.

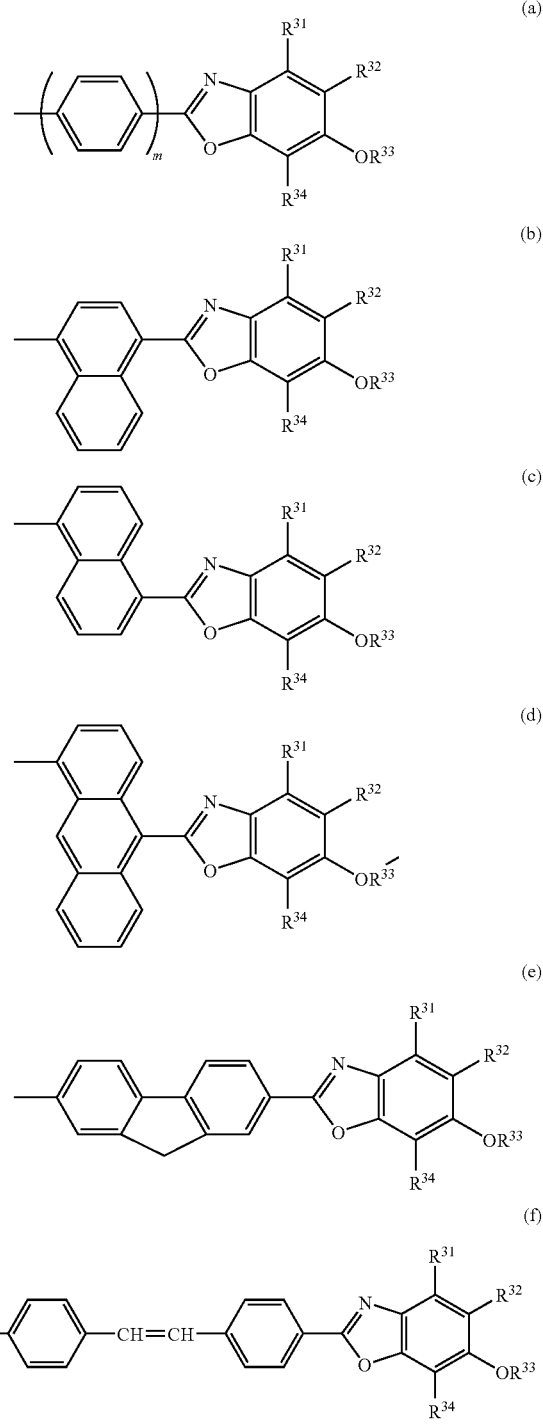

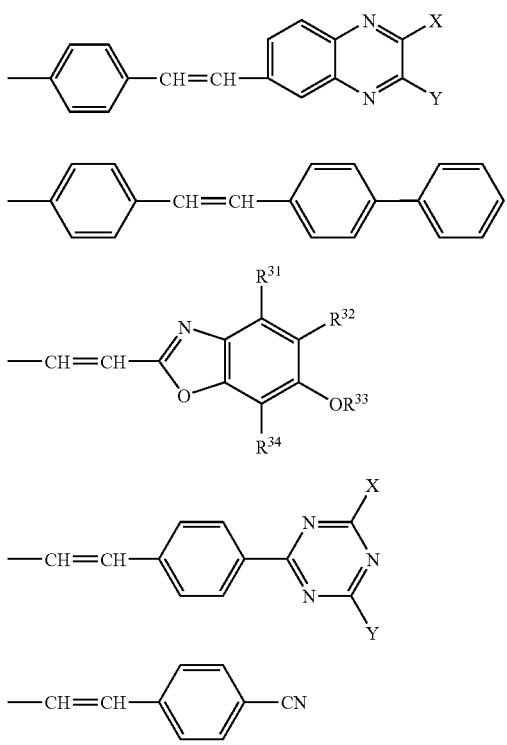

In the formulae, $R^{31}$ and $R^{34}$ are the same as $R^{21}$ and $R^{24}$ above respectively. $R^{32}$ is the same as $R^{22}$ above. $R^{33}$ is the same as $R^{23}$ above.

m is an integer of 1 to 5, preferably an integer of 1 to 3.

X and Y each independently represent an alkyl, aryl, alkoxy, alkylamino, arylamino, amino or hydroxyl group.

Examples of the alkyl groups represented by X and Y include methyl, ethyl, isopropyl, t-butyl and cyclohexyl groups, and the like.

Examples of the aryl groups represented by X and Y include phenyl, toluyl and naphthyl groups, and the like.

Examples of the alkoxy groups represented by X and Y include ethoxy, ethoxy and isopropoxy groups, and the like.

Examples of the alkylamino groups represented by X and Y include aminomethyl, ethylamino, octylamino, dimethylamino and N-methyl-N-ethylamino groups, and the like.

Examples of the arylamino group represented by X and Y include 4-toluylamino and N-methylanilino groups, and the like.

These groups represented by X and Y may have a substituent group additionally, and examples of the substituent groups include the groups in the substituent group V.

Each of X and Y is preferably an aryl, alkoxy or anilino group.

The compound represented by Formula (1) is preferably a compound represented by the following Formula (5).

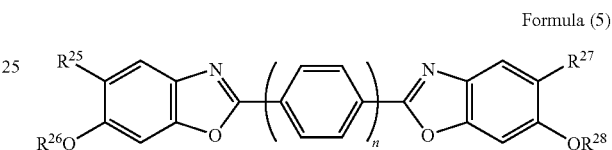

Formula (5)

In Formula (5), $R^{25}$ and $R^{27}$ are the groups the same as $R^{22}$ above; and $R^{26}$ and $R^{28}$ are the groups the same as $R^{23}$ above. n is 1 or 2.

These compounds can be prepared according to the method described in JP-A No. 11-29556.

Typical examples of the fluorescent brighteners used in the invention are listed below, but the invention is not restricted thereby.

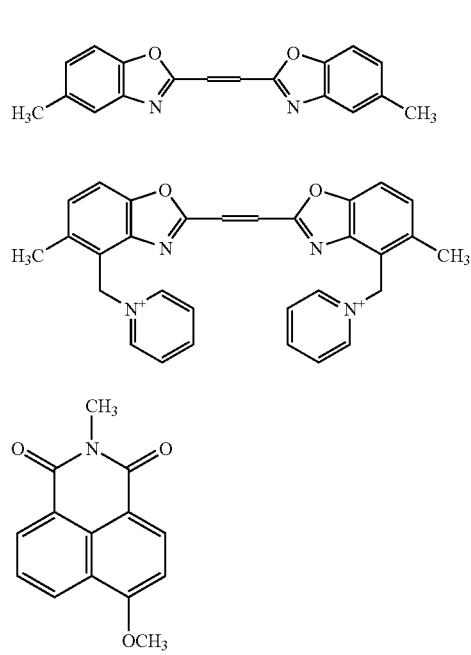

-continued
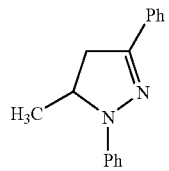
(7)
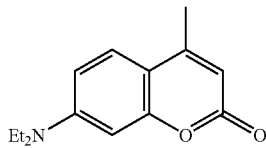
(8)
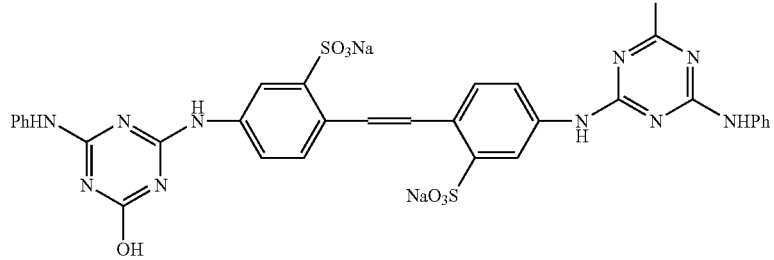
(9)
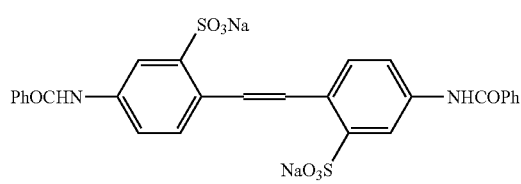
(10)
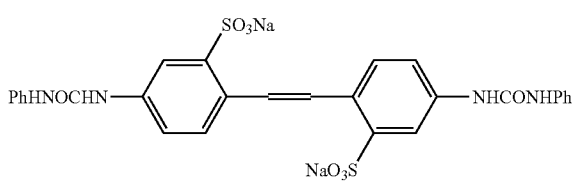
(11)
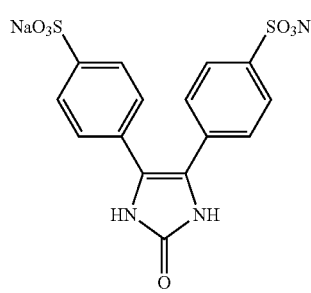
(12)
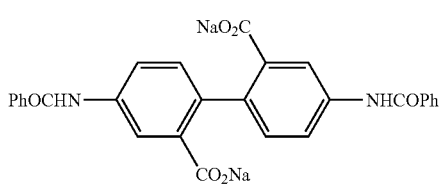
(13)
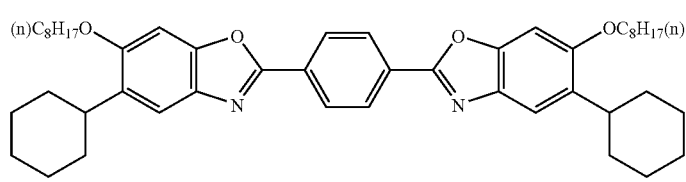
(14)
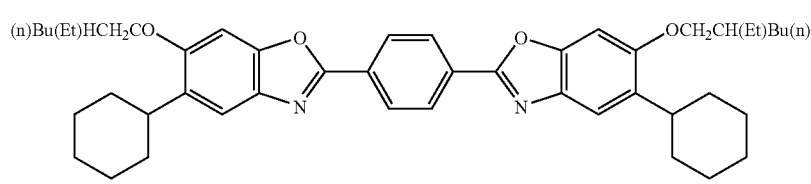
(15)
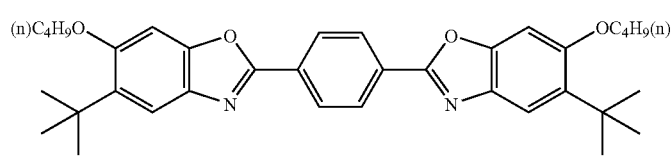
(16)
(17)

-continued
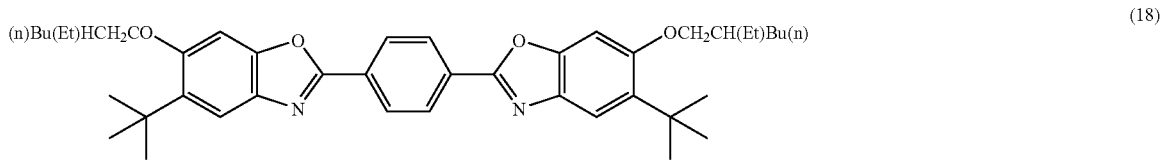
(18)
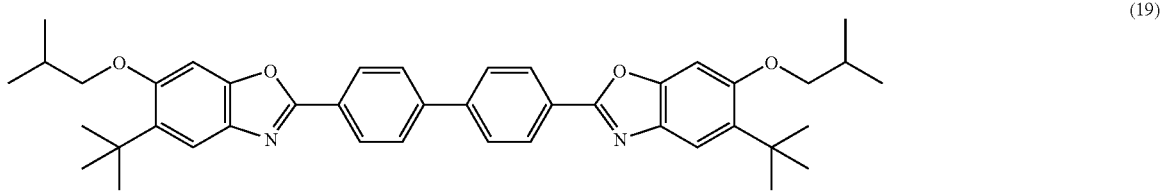
(19)
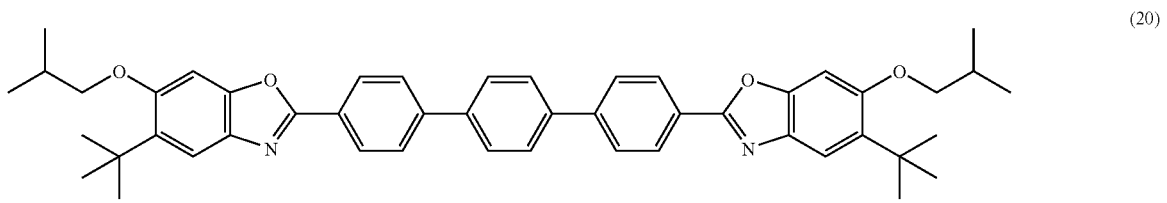
(20)
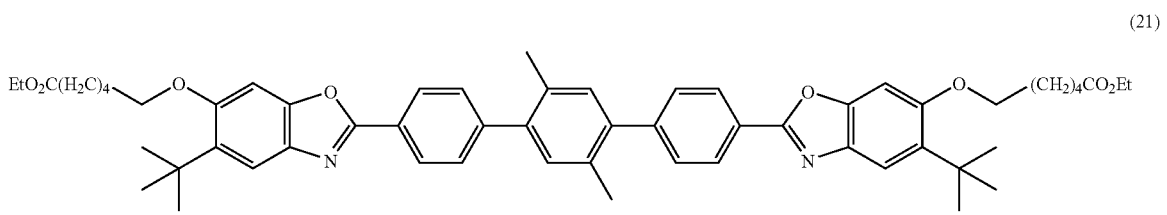
(21)
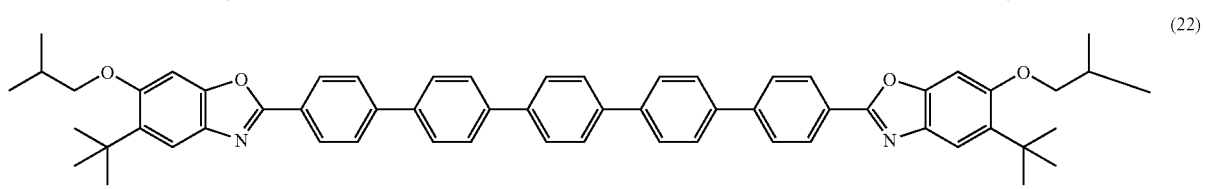
(22)
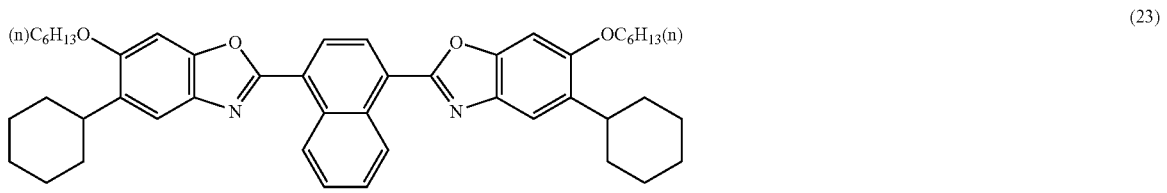
(23)
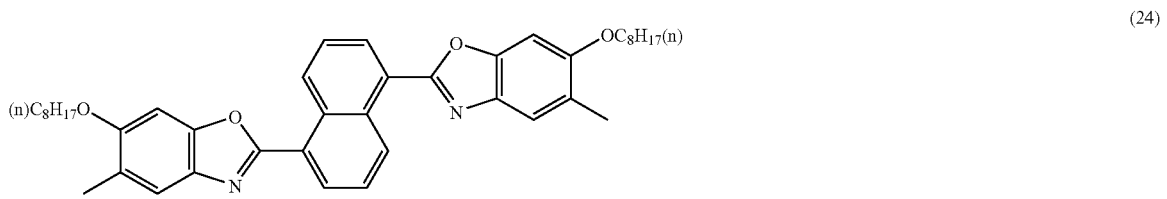
(24)
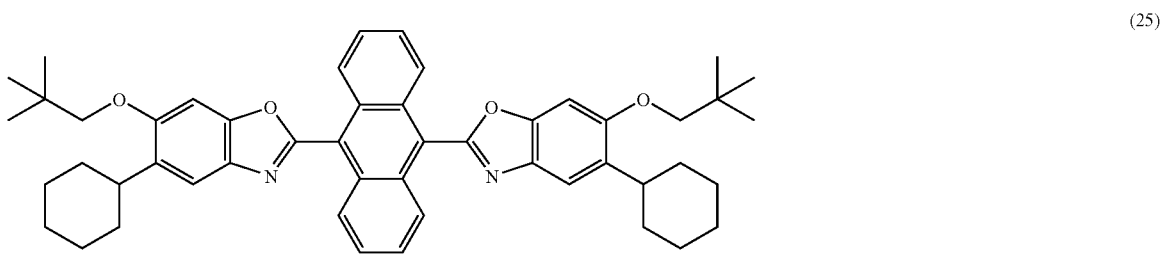
(25)

-continued
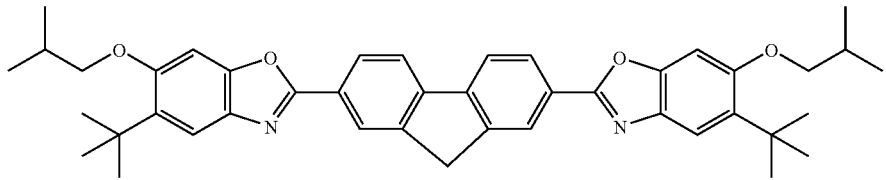 (26)
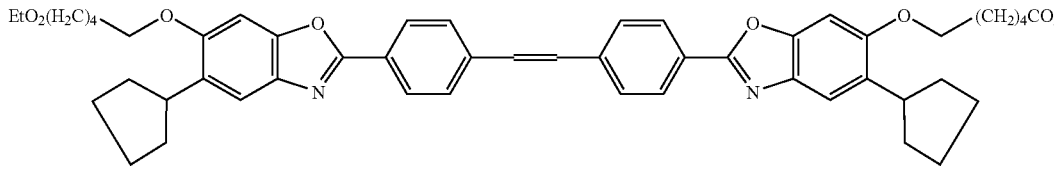 (27)
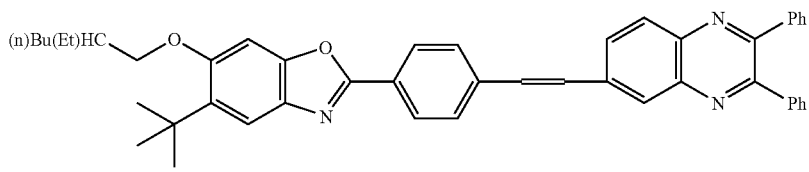 (28)
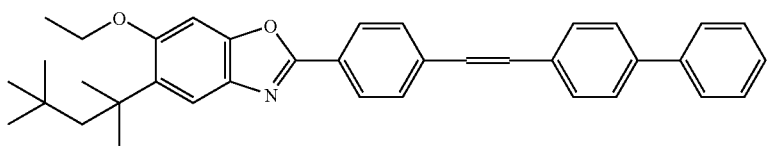 (29)
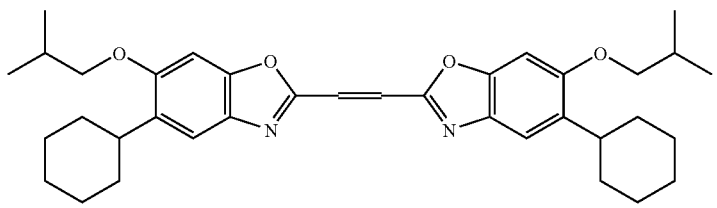 (30)
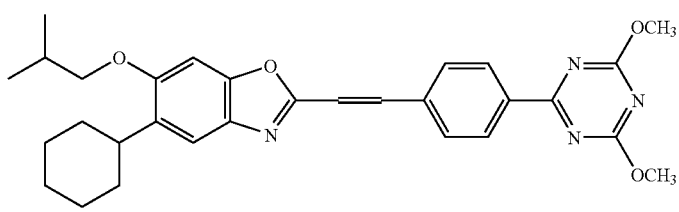 (31)
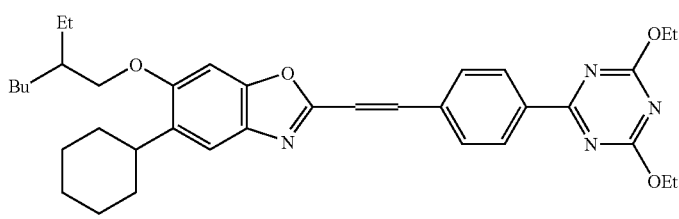 (32)
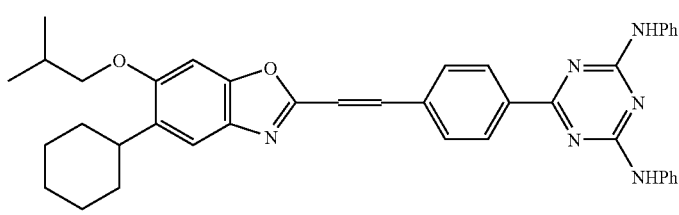 (33)

-continued

(34)
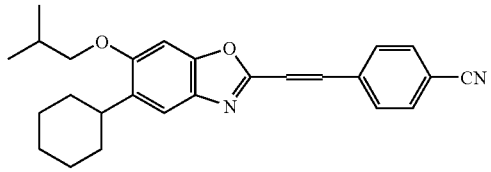

(35)
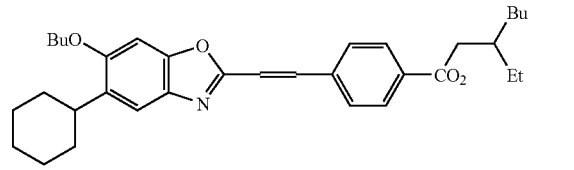

The fluorescent brighteners described above are all organic materials, but it may be an inorganic material. These fluorescent brighteners may be used alone or in combination of two or more as needed. The amount thereof added varies according to the thickness of the substrate, the properties of the fluorescent brightener, presence or absence of an ultraviolet absorber, and the addition amount thereof can be determined easily by those skilled in the art. The content of 0.1 to 50 mass % is generally sufficient, in the case of a coated film having a thickness of 0.1 millimeter. The blending amount may be considered to almost inversely proportionate to the thickness of the material to be added. For example, it is possible to cut a light at 200 nm or more and 410 nm or less effectively and practically, by adding the compound of Formula (1) in an amount of 5 mass %, the compound of Formula (2) in an amount of 3 mass %, or the compound of Formula (13) in an amount of 2.1 mass % addition, to a coated film having a thickness of 0.1 millimeter.

Adding a fluorescent brightener to the transparent resin coating as described above would be satisfactory to perform the invention. However, when the light stability of the fluorescent brightener is lower or when the fluorescent brightener is not sufficiently effective in cutting light in the short wavelength region, an ultraviolet absorber may be preferably used additionally. The layer containing the fluorescent brightener may further contain an ultraviolet absorber. Generally, ultraviolet absorbers are compounds that absorb ultraviolet ray and convert it into heat. The compounds are grossly grouped into benzotriazole, benzophenone, salicylic acid, and cyanoacrylate-based compounds.

The effective absorption wavelength of the benzotriazole compounds is approximately 270 to 380 nm, and typical examples thereof include 2-(2'-hydroxy-5'-methylphenyl) benzotriazole, 2-(2'-hydroxy-5'-t-butylphenyl)benzotriazole, 2-(2'-hydroxy-3',5'-di-t-butylphenyl)benzotriazole, 2-(2'-hydroxy-3'-t-butyl-5'-methylphenyl)-5-chlorobenzotriazole, 2-(2'-hydroxy-3',5'-di-t-butylphenyl)-5-chlorobenzotriazole, 2-(2'-hydroxy-3',5'-di-t-amylphenyl)benzotriazole, 2-(2'-hydroxy-4'-octoxyphenyl)benzotriazole, and the like.

The effective absorption wavelength of the benzophenone compounds is approximately 270 to 380 nm, and typical examples thereof include 2,4-dihydroxybenzophenone, 2-hydroxy-4-methoxybenzophenone, 2-hydroxy-4-octoxybenzophenone, 2-hydroxy-4-dodecyloxybenzophenone, 2,2'-dihydroxy-4-methoxybenzophenone, 2,2'-dihydroxy-4,4'-dimethoxybenzophenone, 2-hydroxy-4-methoxy-5-sulfobenzophenone, and the like.

The effective absorption wavelength of the salicylic acid compounds is approximately 290 to 330 nm, and typical examples thereof include phenyl salicylate, p-t-butylphenyl salicylate, p-octylphenyl salicylate, and the like.

The effective absorption wavelength of the cyanoacrylate-based compounds is approximately 270 to 350 nm, and typical examples thereof include 2-ethylhexyl-2-cyano-3,3-diphenyl acrylate, ethyl-2-cyano-3,3-diphenyl acrylate, and the like.

These ultraviolet absorbers preferably absorb little light in the visible light range (light having a wavelength of 410 nm to 800 nm) used for displaying.

These ultraviolet absorbers may be used alone or in combination of two or more. The preferable addition amount varies according to the thickness of the coated film, the properties of the fluorescent brightener, and others, and can be determined easily by those skilled in the art. The content of 0.1 to 30 mass % is generally sufficient, in the case of a coated film having a thickness of 0.1 millimeter.

In the invention, the layer containing a fluorescent brightener contains a transparent resin component and a fluorescent brightener, and additionally an ultraviolet absorber as needed. As for the content of these components, the content of the fluorescent brightener is preferably 0.1 to 20 mass %, and that of the ultraviolet absorber is 0 to 20 mass %, with respect to the resin (100 mass %).

The thickness of the layer containing a fluorescent brightener is preferably 2 to 1000 μm and more preferably 5 to 200 μm.

The method of coating the transparent resin components is arbitrary, and examples thereof include spraying, dipping coating, roller coating, flow coater coating, flow coating, and the like. The coated film may be dried in different ways according to the transparent resin component used, but preferably, at a temperature of room temperature to 120° C. for approximately 10 to 90 minutes.

<Functional Layers>

Various functional layers may be formed on the image display apparatus according to the invention. Examples of the functional layers include antistatic layer, hardened resin layer (transparent hardcoat layer), anti-reflection layer, white reflective layer, easily adhesive layer, antiglare layer, optical compensation layer, orientation layer, liquid crystal layer, and the like. These functional layers and the materials according to the invention also include a surfactant, a releasing agent, a matting agent, an antistatic layer, a hardcoat layer, and the like. It is also possible to process the film of the invention for prevention of curling.

<Barrier Layer and Organic Layer>

A laminated film made of a barrier layer and an organic layer is preferably formed on the image display apparatus according to the invention. Presence of the laminated film is effective in preventing penetration of water and/or oxygen and deterioration in the properties of the semiconductive layer according to the invention.

As described above, the display layer is placed between two substrates, and the laminated film of a barrier layer and an organic layer is preferably formed on the face of the substrate opposite to that having the display layer. The laminated film of a barrier layer and an organic layer may be formed on both or one of the two substrates, preferably, on both of them.

The number of the layers is not particularly limited, but preferably, 1 to 5 sets of a barrier layer and an organic layer, and more preferably, 1 to 3 sets.

The total thickness of the laminated films of a barrier layer and an organic layer is preferably 1 to 100 μm and more preferably 1 to 50 μm.

(Barrier Layer)

In the invention, the barrier layer is a layer formed for preventing penetration of water and/or oxygen.

The method of forming the barrier layer according to the invention is not particularly limited, if it is within the scope of the invention, but preferable are sputtering, vacuum deposition, ion plating, plasma CVD, and the like; and the methods described in U.S. Pat. No. 3,400,324 and JP-A Nos. 2002-322561 and JP-A No. 2002-361774 may also be used preferably.

The barrier layer according to the invention is particularly preferably an inorganic barrier layer made of an inorganic material, and more preferable examples of the inorganic materials include oxides, nitrides, or oxide nitrides of one or more elements of Si, Al, In, Sn, Zn, Ti, Cu, Ce, Ta, and the like.

The thickness of the barrier layer is also not particularly limited, but the thickness of one barrier layer is preferably in the range of 5 to 1,000 nm, more preferably 10 to 1,000 nm, and particularly preferably 10 to 200 nm. When two or more barrier layers are formed, the respective layers may be the same as or different from each other in composition.

Use of silicon oxide or silicon oxide nitride as the barrier layer is preferable, for improvement both in steam barrier properties and transparency.

When silicon oxide $SiO_x$ is used, for example, as the barrier layer, x is preferably in the range of $1.6<x<1.9$, for obtaining preferable steam barrier properties and high light transparency.

The silicon oxide nitride $SiO_xN_y$ film is preferably a oxygen-rich film having x and y respectively in the ranges of $1<x<2$, and $0<y<1$ for improvement in adhesiveness, and a nitrogen-rich film in the ranges of $0<x<0.8$ and $0.8<y<1.3$ for more improvement in steam barrier properties.

(Organic Layer)

The barrier layer and the organic layer are laminated in the invention, for reduction of the brittleness and improvement of the barrier properties of the barrier layer.

The thickness of the organic layer is not particularly limited, but preferably 10 to 5,000 nm, more preferably 10 to 2,000 nm, and particularly preferably 10 nm to 5,000 nm. At such a thickness, the organic layer having compensates the structural defect of the barrier layer more efficiently and improves the barrier properties further. Alternatively when the organic layer is too thick, it leads to a problem of the deterioration in the barrier properties due to cracking of the organic layer by external force such as bending.

The organic layer is formed, for example, by (1) a method of using an inorganic oxide layer prepared by sol-gel method or (2) a method of laminating an organic material by coating or vapor deposition and hardening the material by ultraviolet ray or electron beam irradiation. Alternatively, the methods (1) and (2) may be used in combination, and, for example, the organic layer may be formed by forming a thin film on the resin film by the method (1), forming an inorganic oxide layer, and then forming a thin film by the method (2).

(1) Sol-Gel Method

By the sol-gel method according to the invention, a dense thin film is formed by allowing a metal alkoxide to hydrolyze and polycondense preferably in solution or coated film. It is also possible then to form an organic-inorganic hybrid material by using a resin in combination.

The metal alkoxide used is a metal alkoxide other than alkoxysilanes and/or alkoxysilanes. Preferable examples of the metal alkoxides other than the alkoxysilanes include zirconium alkoxides, titanium alkoxides, aluminum alkoxides, and the like.

The resin used additionally in the sol-gel reaction preferably has hydrogen bond-forming groups.

Examples of the resins containing hydrogen bond-forming groups include hydroxyl group-containing polymers and the derivatives thereof (polyvinylalcohol, polyvinylacetal, ethylene-vinyl alcohol copolymers, phenol resins, methylol melamines, and the derivatives thereof); carboxyl group-containing polymers and the derivatives thereof (polymers or copolymers containing a polymerizable unsaturated acid unit such as poly(meth)acrylic acid, maleic anhydride, or itaconic acid, and the esters of these polymers (polymers and copolymers containing a unit of a vinyl ester such as vinyl acetate or a (meth)acrylate ester such as methyl methacrylate), etc.); ether bond-containing polymers (polyalkyleneoxide, polyoxyalkylene glycol, polyvinyl ether, silicon resin, etc.); amide bond-containing polymers (polyoxazolines having a >N(COR)— bond, i.e., a trivalent group of N(COR) (wherein, R represents a hydrogen atom, an alkyl group that may have one or more substituents, or an aryl group that may have one or more substituents), and N-acylated polyalkylene imines); polyvinylpyrrolidones having a >NC(O)— bond, i.e., a trivalent group of NC(O), and the derivatives thereof, urethane bond-containing polyurethanes; urea bond-containing polymers; and the like.

The amount of the resin used is 0.1 to 100 moles, more preferably 0.5 to 50 moles, with respect to 1 mole of the metal alkoxide.

It is also possible to prepare an organic-inorganic hybrid material, by adding a monomer during the sol-gel reaction and allowing it to polymerize during or after the sol-gel reaction. Examples of the monomers include acrylates, methacrylates, and isocyanates.

The amount of the monomer used is 0.1 to 100 moles, more preferably 0.5 to 50 moles, with respect to 1 mole of the metal alkoxide.

The metal alkoxide is hydrolyzed and polycondensed in water or an organic solvent in the sol-gel reaction, and a catalyst is preferably used at the time. Generally, an acid (organic or inorganic acid) is used as the hydrolysis catalyst.

The amount of the acid is preferably 0.0001 to 0.05 mole, more preferably 0.001 to 0.01 mole, with respect to 1 mole of the metal alkoxide (alkoxysilane+other metal alkoxides, when an alkoxysilane and other metal alkoxides are contained).

After hydrolysis, a basic compound such as inorganic base or amine may be added to neutralize the solution and accelerate the subsequent polycondensation.

Any one of other sol-gel catalysts, including organic metal compounds such as metal chelate compounds having Al, Ti, or Zr as the central metal and tin compounds, and metal salts such as alkali-metal salts of organic acid, may be used in combination. The content of the sol-gel catalyst compound in the composition is preferably 0.01 to 50 mass %, more preferably 0.1 to 50 mass %, and still more preferably 0.5 to 10 mass % with respect to the raw sol material alkoxysilane.

Hereinafter, the solvent used in the sol-gel reaction will be described. The solvent allows easier preparation of the composition according to the invention by dispersing the sol components uniformly, making the composition applicable to various coating methods, and improves the dispersion stability and storage stability of the composition. The solvent is not particularly limited, if it is preferable for that purpose above. Preferable examples of these solvents include water, and highly water-miscible organic solvents.

The amount of the solvent used is preferably 1 to 100,000 mass %, more preferably 10 to 10,000 mass %, with respect to the metal alkoxide.

For the purpose of regulating the velocity of the sol-gel reaction, an organic compound capable of multidentate coordination may be added to stabilize the metal alkoxide. Examples thereof include β-diketones and/or β-ketoesters, and alkanol amines.

Typical examples of the β-diketones and/or the β-ketoesters include acetylacetone, methylacetoacetate, ethylacetoacetate, n-propyl acetoacetate, i-propyl acetoacetate, n-butyl acetoacetate, sec-butyl acetoacetate, tert-butyl acetoacetate, 2,4-hexan-dione, 2,4-heptan-dione, 3,5-heptandione, 2,4-octan-dione, 2,4-nonan-dione, 5-methyl-hexandione, and the like. Among them, ethylacetoacetate and acetylacetone are preferable, and acetylacetone is particularly preferable. These β-diketones and/or the β-ketoesters may be used alone or in combination of two or more.

When one of the metal chelate compounds is used as the sol-gel catalyst, the multidentate-coordinating compound may also be used for regulating the reaction rate.

The amount of the multidentate-coordinating compound used is preferably 0.1 to 100 moles, more preferably 0.5 to 50 moles, with respect 1 mole of the metal alkoxide.

Hereinafter, the method of applying the sol-gel reaction composition will be described. The sol may be applied on a film as a thin film, by a coating method such as curtain flow coating, dip coating, spin coating, or roll coating.

In such a case, the sol may be hydrolyzed in any period of the production process. Preferably used is, for example, a method of preparing a desirable sol by hydrolyzing and partially condensing a solution in a suitable composition and applying and drying the sol, a method of preparing a solution in a suitable composition, coating and drying the solution while allowing hydrolysis and partial condensation, a method of coating a solution, applying another aqueous solution for hydrolysis, and thus allowing hydrolysis of the ingredients, or the like. The application method is not particularly limited, but preferable from the viewpoint of productivity is a method of extruding a lower-layer coating solution and an upper-layer coating solution at a flow rate suitably adjusted by an extruder having multi-stage ejection nozzles and applying and drying the multi-layered flow continuously on a substrate (simultaneous multi-layer coating).

The drying temperature of the sol-gel reaction composition after application is preferably 150 to 350° C., more preferably 150 to 250° C., and more preferably 150 to 200° C.

An energy ray may be irradiated, to make the organic layer further denser after application and drying. The radiation ray is not particularly limited, but irradiation of ultraviolet ray, electron beam or microwave is particularly preferable, considering the adverse effects such as deformation and denaturation on the substrate.

The irradiation intensity is preferably 30 mJ/cm$^3$ to 500 mJ/cm$^3$ and more preferably 50 mJ/cm$^3$ to 400 mJ/cm$^3$. The irradiation temperature is arbitrary in the range from room temperature to the deformation temperature of the substrate, but preferably 30° C. to 150° C., and more preferably 50° C. to 130° C.

(2) Method of Forming an Organic Film by Coating or Vapor Deposition and Hardening the Film by Irradiation of Ultraviolet Ray or Electron Beam A case where an organic layer is formed by ultraviolet ray or electron beam irradiation of a monomer will be described below. The monomer is not particularly limited if it contains a group that crosslinks by irradiation of ultraviolet ray or electron beam, but preferably a monomer having an acryloyl, methacryloyl, or oxetane group.

The organic material preferably contains, as the principal component, a polymer obtained by polymerizing a monomer containing a bifunctional or higher acryloyl group or a methacryloyl group such as epoxy (meth)acrylate, urethane (meth)acrylate, isocyanuric acid (meth)acrylate, pentaerythritol (meth)acrylate, trimethylolpropane (meth)acrylate, ethylene glycol (meth)acrylate, or polyester (meth)acrylate. The monomers containing a bifunctional or higher acryloyl or methacryloyl group be used in combination of two or more; and monofunctional (meth)acrylates may be used in combination.

The oxetane group-containing monomer is preferably a monomer having the structure described in Formulae (3) to (6) of JP-A No. 2002-356607. In such a case, these monomers may be used as a mixture at an arbitrary ratio.

In particular, use of an acryl isocyanurate, epoxy acrylate, or urethane acrylate having a higher crosslinking degree and a glass transition temperature of 200° C. or higher as the principal component is preferable, from the viewpoint of the heat and solvent resistance demanded for display applications.

The method of coating or vapor-depositing the organic material in the method (2) is not particularly limited.

For example, if an organic layer is desirably formed by a vacuum filming method, film-forming methods such as vapor deposition and plasma CVD are preferable, and a resistance-heating vapor deposition method, which allows easier control of the filming velocity of the organic monomer, is more preferable.

If the organic layer is formed by a coating mode, it is possible to use one of various application methods commonly used, such as spray coating, spin coating, and bar coating.

The method of crosslinking the organic monomer by the method (2) is not particularly limited, but crosslinking by electron beam, ultraviolet ray, or the like is preferable, because it is possible to install such a device in a vacuum chamber easily and to accelerate polymerization in the crosslinking reaction.

(Water Absorbent)

In the invention, a water absorbent shown below may be used additionally, between the substrate and the laminated film of an organic layer and a barrier layer, in the top layer of the laminated film, between the organic layer and the barrier layer, or in the organic or barrier layer.

The water absorbent is selected from water-absorbing compounds mostly containing an alkali-earth metal. Examples thereof include BaO, SrO, CaO, MgO, and the like. It may also be selected from metal elements such as Ti, Mg, Ba, and Ca.

The particle diameter of the absorbent particles is preferably 100 nm or less and more preferably 50 nm or less.

The water absorbent-containing layer, if formed separately, may be formed by vapor deposition under vacuum, similarly to the barrier layer described above; or alternatively, by using nanoparticles prepared by any method. The thickness of the absorbent layer is preferably 1 to 100 nm and more preferably 1 to 10 nm.

The amount of the water absorbent coated is preferably $10^{-4}$ g/m$^2$ to $10^2$ g/m$^2$ and more preferably $10^{-3}$ g/m$^2$ to 10 g/m$^2$.

When it is added to the barrier layer, the barrier layer is formed preferably by co-vapor deposition.

When it is added to the organic layer, the layer is preferably prepared by dissolving the water absorbent in the organic material and coating the solution.

(White-Colored Reflective Layer)

In the image display apparatus according to the invention, a white reflective layer containing, for example, titanium oxide may be formed on the substrate. An optically reflective white substrate may be used, as described for the substrate. In such a case, a plastic substrate containing an inorganic pigment such as titanium oxide or zinc oxide may be used as the substrate.

<Configuration of Image Display Apparatus>

The image display apparatus according to the invention has at least a substrate, a transparent electrode, a field-effect transistor described above (hereinafter, referred to as "organic TFT"), a display layer, and a layer containing a fluorescent brightener, independently of which mode the display layer is in.

The fluorescent brightener-containing layer and the semiconductive organic TFT layer are preferably formed respectively on the opposite faces of the substrate, for improvement in the durability of the semiconductive layer.

In addition, the fluorescent brightener-containing layer is preferably formed on the face of the substrate opposite to the display layer. It is because, when formed on the display layer-sided face, it causes decrease in the effective voltage applied to the liquid crystal layer and accordingly in display performance.

It is also preferable to form a white reflective layer 11 on the organic TFT-sided surface of the substrate 1.

The compositions of the substrate, transparent electrode, organic TFT, display layer, and fluorescent brightener-containing layer are the same as those described above in detail.

An optically reflective white substrate may be used, as described for the substrate. In such a case, a plastic substrate containing an inorganic pigment such as titanium oxide or zinc oxide may be used as the substrate, or a white reflective layer containing for example titanium oxide may be formed on the substrate.

Any one of known methods may be applied in preparation of the image display apparatus according to the invention.

Figure 2:
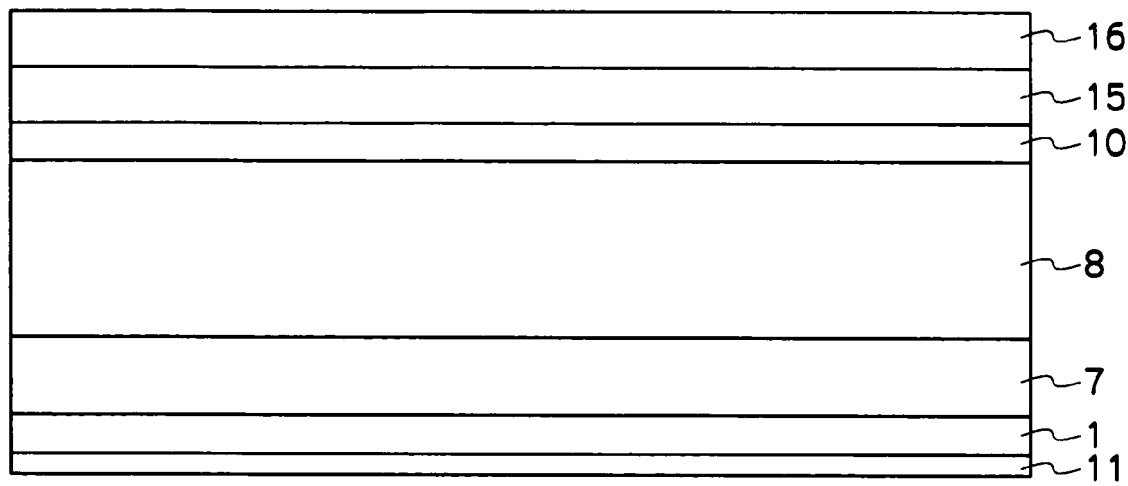
FIG. 2 is a schematic sectional view illustrating a first example of the image display apparatus according to the invention.

FIG. 2 is a schematic sectional view illustrating the configuration of an image display apparatus according to the invention using an electrophoretic display layer as its display layer.

An organic TFT 7, an electrophoretic display layer 8, and a transparent electrode 10 are formed as they are laminated between two substrates (substrates) 1 and 15, and a fluorescent brightener-containing layer 16 is formed on the substrate 15 having the transparent electrode 10, and a white reflective layer 11 is formed on the surface of the substrate having the organic TFT 7.

Figure 3:
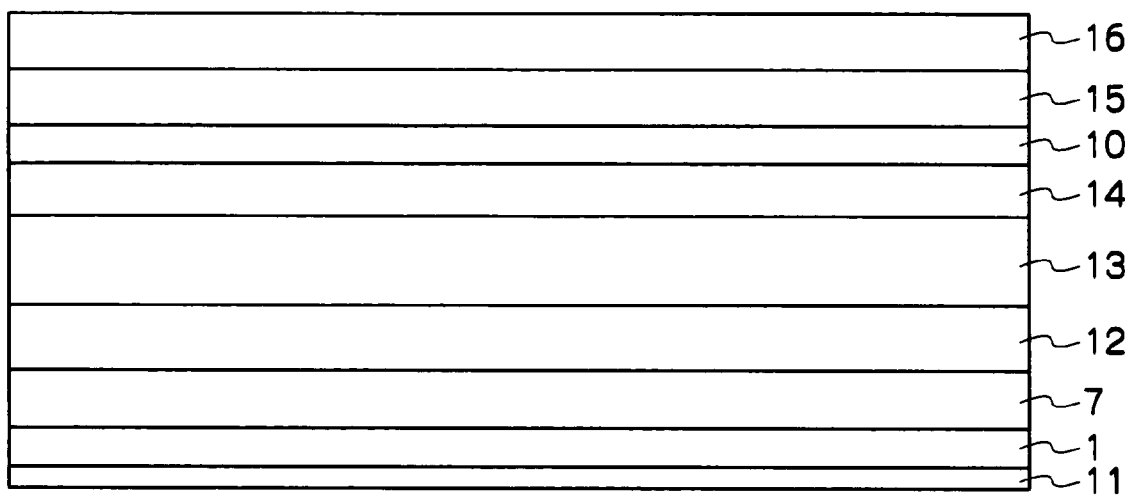
FIG. 3 is a schematic sectional view illustrating a second example of the image display apparatus according to the invention.

FIG. 3 is a schematic sectional view illustrating the configuration of another image display apparatus according to the invention having a guest-host liquid crystal display layer as its display layer.

When the display layer is a guest-host liquid crystal display layer, it is preferable to form an oriented layer on the surface of the substrate in contact with the liquid crystal, for orientation of the liquid crystal. The oriented film can be formed, for example, by a method of coating a quaternary ammonium salt and orienting the salt on a substrate, a method of coating a polyimide resin and orienting the resin by rubbing, a method of obtaining a SiO$_x$ film by vapor deposition from the inclined direction, an orientation method by photoirradiation by using photoisomerization, or the like. Examples of the oriented films include those described in Liquid Crystal Device Handbook, Japan Society for the Promotion of Science, 142 Committee Ed., Nikkankogyo Shimbun, 1989, p. 240 to 256.

As shown in FIG. 3, an organic TFT 7, a polyimide orientation layer 12, a liquid crystal layer 13, a polyimide orientation layer 14, a transparent electrode 10, and a substrate 15 are preferably formed on a substrate (substrate) 1 in that order; in addition, a layer containing a fluorescent brightener 16 is preferably formed on the face of the substrate 15 having an transparent electrode 10 opposite to the liquid crystal; and a white reflective layer 11 is preferably formed on the face of the substrate 1 having the organic TFT 7 opposite to the liquid crystal.

The image display apparatus having a guest-host liquid crystal display layer can be prepared by connecting the substrates via a spacer at an interval of 1 to 50 μm and forming the guest-host liquid crystal layer in the space. The spacer used is, for example, that described in Liquid Crystal Device Handbook, Japan Society for the Promotion of Science, 142 Committee Ed., Nikkankogyo Shimbun, 1989, p. 257 to 262. Respective layers are formed in the space between the substrates by coating or printing on one of the substrates.

EXAMPLES

Hereinafter, the invention will be described in detail with reference to Examples. The invention could be effectively performed in accordance with the following Examples, but the Examples should not be construed to limit the scope of the invention.

Example 1

FIG. 2 shows the configuration of the image display apparatus in the present Example. However, the white reflective layer 11 in FIG. 2 was not formed in Example 1.

(Preparation of Organic TFT)

FIG. 1 shows the structure of a π-conjugated dendritic polymer field-effect transistor in the Example.

First, chromium was vapor-deposited on a nonalkali glass plate 1, to provide a gate electrode 2. A silicon oxide film (gate insulator) 3 having a thickness of 2,000 angstroms was then deposited thereon by sputtering, and chromium and gold were vapor-deposited in that order by a common photolithographic technology, to form a source electrode 4 and a drain electrode 5.

The substrate carrying the gate electrode 2, silicon oxide film 3, source electrode 4 and drain electrode 5 thus formed is then surface-roughened, as it is immersed in hydrofluoric acid at a concentration of 10%, and the face of the substrate carrying the source electrode 4 and drain electrode 5 was immersed in a chloroform solution containing a hexyl oligothiophene compound (manufactured by Aldrich) at 2 mass % and drawn from it gradually, to form a semiconductive layer 6.

In this manner, prepared was a π-conjugated dendritic polymer field-effect transistor having a channel length of 10 μm, a channel width of 1 mm, and a semiconductive layer thickness of approximately 0.2 μm. The transistor had an electron field-effect mobility of $8 \times 10^{-3}$ cm$^2$/V·sec and an on/off ratio in the approximately 5-digit order.

(Preparation of Electrophoretic Display Layer)

Microcapsules containing titanium oxide as white charged particles, carbon black as black charged particles, and paraffin as the insulating liquid in polyurethane shell were prepared from the dispersion thereof by interfacial polymerization. The average particle diameter of the microcapsules was 50 μm, and the average wall thickness of the microcapsules was 4 μm.

The microcapsules were applied on the organic TFT 7 above, to form an electrophoretic display layer 8.

(Preparation of Substrate Having Electrodes)

Separately, a transparent electrode (ITO electrode) 10 of indium tin oxide was formed on the glass plate 15 above.

The substrate 15 and the glass plate 1 having an electrophoretic display layer 8 prepared above were adhered to each other, with the electrophoretic display layer 8 held between them, as shown in FIG. 2.

(Layer Containing a Fluorescent Brightener and an Ultraviolet Absorber)

85 g of a mixture of toluene and methylethylketone (1:1) was added to 15 g of a mixture of 100 mass % of Acrytec (trade name, manufactured by Dainippon Ink and Chemicals), 5.0 mass % of the compound represented by Formula (14), and 1.1 mass % of 2-(2'-hydroxy-5'-t-butylphenyl)benzotriazole; and the solid matters were dissolved, to provide a composition containing the fluorescent brightener and the ultraviolet absorber.

The composition was applied on the outer surface of the glass plate 15 (not on the display layer side), forming a layer 16 containing the fluorescent brightener and the ultraviolet absorber 16 having a thickness of 100 μm after drying, to provide an image display apparatus according to the invention.

Its visible and ultraviolet absorption spectrum revealed that the absorbance of the light in the wavelength range of 200 nm to 410 nm by the composition containing the fluorescent brightener and the ultraviolet absorber was 90% or more.

(Evaluation of Display Performance)

When a DC voltage was applied to the transparent electrode having a semiconductive layer as the positive pole and to the opposing transparent electrode as the negative pole by using a signal generator (manufactured by Toyo Corporation), the element obtained turned black in color because of migration of its black carbon-black particles toward the display side.

Alternatively, when a DC voltage was applied to the transparent electrode having a semiconductive layer as the negative pole and to the opposing transparent electrode as the positive pole, the element turned white, because of migration of the white titanium oxide particles toward the display side.

Further, when the DC voltage was applied alternately while the polarity was changed, the element changed between black and white alternately, and the efficiency of the color change was preserved even after repetition for 10,000 times.

Then, a light from a high-pressure mercury lamp was irradiated on the image display apparatus according to the invention for 120 hours, and the same experiment repeated, but the efficiency in the color change was preserved.

Comparative Example 1

An image display apparatus of Comparative Example 1 was obtained in a similar manner to Example 1, except that, in the layer containing a fluorescent brightener and an ultraviolet absorber, the compound represented by Formula (14) and 2-(2'-hydroxy-5'-t-butylphenyl)benzotriazole were replaced by ISCLARL (trade name) manufactured by Sumitomo 3M.

The composition containing ISCLARL (trade name) manufactured by Sumitomo 3M was confirmed to have an absorbance of 85% for light having a wavelength of 410 nm.

(Evaluation of Display Performance)

Light from a high-pressure mercury lamp was irradiated on the image display apparatus of Comparative Example 1 for 120 hours in a similar manner to Example 1, and visual observation revealed that the density of the color during color development decreased and the transparency during decoloration also decreased.

Thus, the image display apparatus according to the invention was shown to be superior in the display performance during the repetition than the image display apparatus of Comparative Example 1.

Example 2

Figure 4:
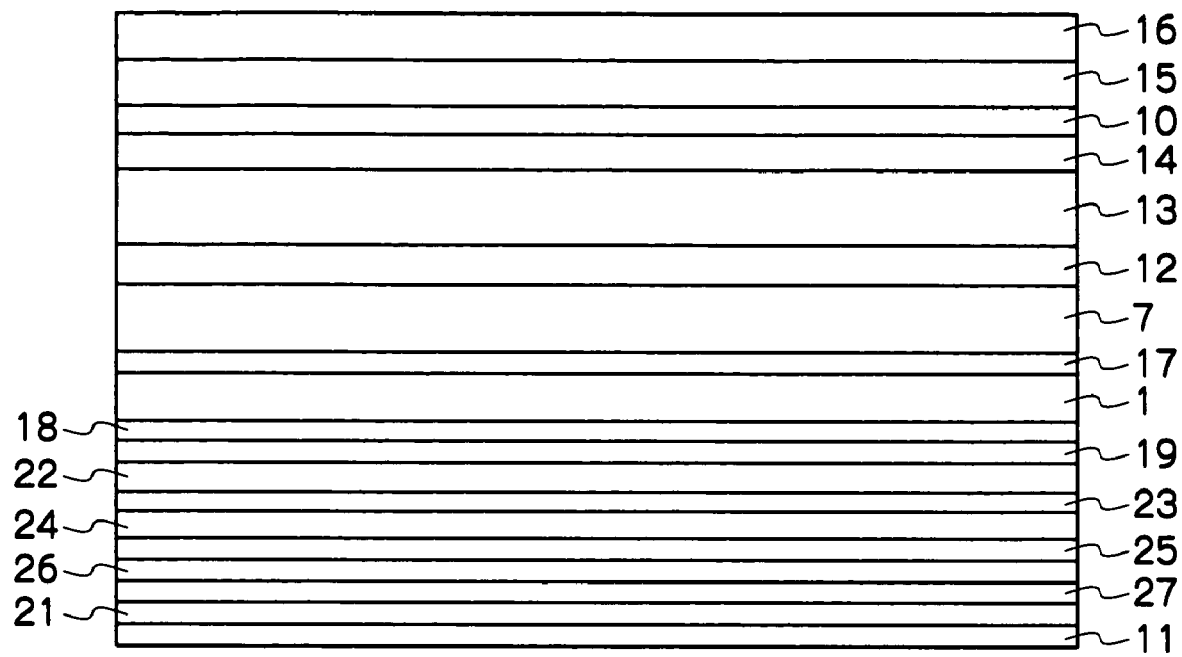
FIG. 4 is a schematic sectional view illustrating the image display apparatus of Example 2.

FIG. 4 shows the configuration of the image display apparatus in the present Example.

1. Preparation of Plastic Substrate

An undercoat layer and a back layer were formed on a PEN film (Q65A, manufactured by DuPont Teijin) in a similar manner as the sample 110 in Example 1 of JP-A No. 2000-105445.

Specifically, 100 wt parts of a polyethylene-2,6-naphthalate polymer and 2 wt parts of an ultraviolet absorber Tinuvin P.326 (manufactured by Ciba Geigy) were dried and then melted at 300° C., and extruded through a T die, and the resulting film was stretched 3.3 times in the machine direction at 140° C. and then 3.3 times in the width direction at 130° C., and heat-set at 250° C. for 6 seconds, to provide a plastic substrate 1 (PEN) having a thickness of 90 μm.

2. Formation of Functional Layers (Formation of Undercoat Layer)

Both faces of the plastic substrate were processed in corona discharge treatment, UV irradiation treatment, and glow discharge treatment, and an undercoat solution containing 0.1 g/m$^2$ of gelatin, 0.01 g/m$^2$ of sodium α-sulfodi-2-ethylhexylsuccinate, 0.04 g/m$^2$ of salicylic acid, 0.2 g/m$^2$ of p-chlorophenol, 0.012 g/m$^2$ of (CH=CHSO$_2$CH$_2$CH$_2$NHCO)$_2$CH$_2$, and 0.02 g/m$^2$ of polyamide-epichlorohydrin polycondensate was applied (10 mL/m$^2$, by bar coater) on one face, to form an undercoat layer 17. The film was dried at 115° C. for 6 minutes (the temperatures of the rollers and the conveyor apparatus in the drying zone were all 115° C.). The thermal expansion coefficient of the plastic substrate obtained was 15 ppm/° C.

(Formation of Back Layer)

An antistatic layer 18 having the following composition was formed as the back layer on the other face of the substrate opposite to the undercoat layer, and a releasing layer 19 was formed additionally on the antistatic layer 18, to provide a substrate 1.

(Formation of Antistatic Layer 18)

0.2 g/m$^2$ of a dispersion of fine particles of tin oxide-antimony oxide composite having an average particle diameter of 0.005 μm and a resistivity of 5 Ω-cm (secondary aggregate particle diameter: approximately 0.08 μm) was applied, together with 0.05 g/m$^2$ of gelatin, 0.02 g/m$^2$ of (CH$_2$=CHSO$_2$CH$_2$CH$_2$NHCO)$_2$CH$_2$, 0.005 g/m$^2$ of polyoxyethylene-p-nonylphenol (polymerization degree 10) and 0.22 g/m$^2$ of resorcin.

(Formation of Releasing Layer 19)

A mixture of diacetylcellulose (25 mg/m$^2$) and C$_6$H$_{13}$CH(OH)C$_{10}$H$_{20}$COOC$_{40}$H$_{81}$ (6 mg/m$^2$)/C$_{50}$H$_{101}$O(CH$_2$CH$_2$O)$_{16}$H (9 mg/m$^2$) was coated. The mixture was melted in xylene/propylene glycol monomethylether (1/1) at 105° C., and dispersed in propylene glycol monomethylether (10 times larger amount) at normal temperature and then in acetone (to average particle diameter of 0.01 μm); and the acetone dispersion was used for application.

Silicon dioxide particles (0.3 μm) were added as a matting agent to an amount of 15 mg/m². The film was dried at 115° C. for 6 minutes. The temperatures of the rollers and the conveyor apparatus in the drying zone were all 115° C.

The releasing layer had a dynamic friction coefficient of 0.06 (stainless steel ball of 5 mmϕ in diameter, load: 100 g, speed: 6 cm/minute) and a static friction coefficient of 0.07 (clip method). The dynamic friction coefficient between the display screen and the releasing layer was 0.12.

3. Formation of Barrier Layer

The substrate 1 was processed in the following manners.

A sputtering apparatus in the roll-to-roll mode was used. The apparatus has a vacuum chamber and a drum in the center thereof for cooling the surface of a plastic film in contact. The vacuum chamber also contains a delivery roll and a take-up roll for winding the plastic film. The plastic substrate wound around the delivery roll is wound, via a guide roll, around the drum, and the plastic substrate is wound, via a guide roll, around the roll. As for the vacuum system, the vacuum chamber is consistently deaerated through an exhaust vent by a vacuum pump. As for the film-forming system, a target is place on a cathode connected to a discharge power source in the direct current mode that supplies a pulse power. The discharge power source is connected to a controller, which in turn is connected to a gas flow-adjusting unit, which supplies a reaction gas to the vacuum chamber via piping at a controlled rate. A discharge gas is also supplied to the vacuum chamber at a constant flow rate. Hereinafter, typical conditions thereof will be described.

The target used was Si, and the discharge power source used was a direct-current power source in the pulse application mode. The plastic substrate used was a polyether sulfone film having a thickness of 100 μm (substrate 1 above), which was wound around the delivery roll and fed to the take-up roll. After the substrate was placed in the sputtering apparatus, the vacuum chamber was closed with the door shut and deaerated by a vacuum pump, and the drum therein was cooled. When the ultimate pressure became $4 \times 10^{-4}$ Pa and the drum temperature 5° C., the plastic substrate was conveyed. Argon was fed therein as the discharge gas; the discharge power source was turned on; plasma was generated on the Si target at a discharge power of 5 kW and a filming pressure of 0.3 Pa; and sputtering was continued for 3 minutes. Then, oxygen was introduced therein as the reaction gas. After the discharge is stabilized, the amounts of the argon and oxygen gases supplied were reduced gradually, and the filming pressure was allowed to decrease to 0.1 Pa. After confirmation of stabilized discharge at 0.1 Pa, silicon oxide was allowed to deposit for a certain period, forming a barrier layer 22. The thickness of the barrier layer 22 was 100 nm. After film deposition, the vacuum chamber was returned to atmospheric pressure, and the substrate carrying the silicon oxide film formed was removed.

4. Formation of Organic Layer

Subsequently, 1 mass % of a radical initiator (Irgacure-651: manufactured by Ciba-Geigy Corp.) was added to and dissolved in a solution containing (1) tetraethylene glycol diacrylate, (2) caprolactone acrylate, and (3) tripropylene glycol monoacrylate at a weight ratio of 7:1.2:1.4; and the solution was coated and dried on a polyether sulfone resin substrate having a thickness of 0.1 mm, and the hardened by UV irradiation, to form an organic layer 23 having a thickness of approximately 1 μm on the resin substrate.

5. Laminated Film of a Barrier Layer and an Organic Layer

A barrier layer 24, an organic layer 25, a barrier layer 26, and an organic layer 27 are laminated in that order by repeating the operations 3 and 4 above, to provide a laminated film having three barrier layers and three organic layers.

In addition, a hardcoat layer 21 was formed by the method described in JP-A No. 6-123806.

6. Preparation of Organic TFT

A field-effect transistor (organic TFT 7) was prepared in a similar manner to Example 1, except that the oligothiophene compound used in Example 1 was replaced by pentacene, a semiconductive layer 6 was prepared with pentacene by vapor deposition, and the substrate was changed from the glass plate to the plastic substrate having a laminated film prepared in 1 to 5.

The transistor had an electron field-effect mobility of $2 \times 10^{-1}$ cm²/V·sec and an on/off ratio of approximately in the 5-digit order.

A white reflective layer 11 was formed, by applying a coating dispersion containing a white pigment of titanium oxide surface-inactivated by surface treatment and 5 mass % carboxy cellulose on the face of the substrate opposite to the face having a semiconductive layer.

7. Formation of Liquid Crystal Layer

A vertically oriented polyimide film 12 (part number: JALS-2021, manufactured by JSR) was formed on a semiconductive layer, and a guest-host liquid crystal layer 13 containing a liquid crystal composition containing a cyanobased nematic liquid crystal ZLI-2806 having negative dielectric anisotropy (manufactured by Merck) as the host liquid crystal, the following dichroic dye in an amount of 1 mass %, and a chiral agent R-811 (manufactured by Merck) in an amount of 1 mass % was formed thereon.

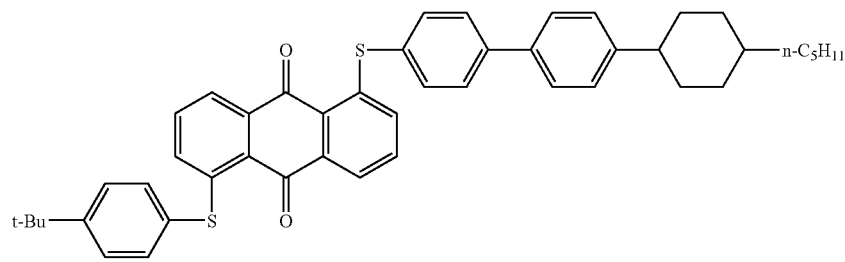

Structure of dichroic dye

8. Preparation of Substrate Carrying Electrode

Separately, a transparent indium tin oxide electrode layer 10 and a vertically oriented polyimide film (manufactured by Nissan Chemical Industries) 14 were formed on the plastic substrate described above (preferably, PEN) 15.

The substrate 15 and the plastic substrate 1 having a liquid crystal layer 13 prepared above were bound to each other as shown in FIG. 4, with the vertically oriented polyimide film and the transparent electrode holding the liquid crystal layer 13 inside.

9. Layer Containing the Fluorescent Brightener and the Ultraviolet Absorber 15 g of a mixture of 100 mass % of Acrytec (trade name, manufactured by Dainippon Ink and Chemicals), 5.0 mass % of the compound represented by Formula (14) and 1.1 mass % of 2-(2'-hydroxy-5'-t-butylphenyl)benzotriazole was added to and dissolved in 85 g of a mixture of toluene and methylethylketone (1:1), to provide a composition containing the fluorescent brightener and the ultraviolet absorber.

The composition was applied on the face of the plastic substrate 15 opposite to the face carrying a transparent electrode to a thickness of 100 μm after drying, forming a layer containing the fluorescent brightener and the ultraviolet absorber 16, to provide an image display apparatus according to the invention.

Analysis of the visible-ultraviolet absorption spectrum revealed that the composition containing the fluorescent brightener and the ultraviolet absorber had an absorbance of 90% or more of the light in the wavelength range of 200 nm or less and 410 nm or less.

(Evaluation of Display Performance)

When an AC voltage (20 V, 100 Hz) was applied to the element obtained by using a signal generator (manufactured by Toyo Corporation), the element turned yellow in color only in the region where the voltage was applied. In addition, when on/off of the AC voltage was repeated 10,000 times, the element turned color alternately between yellow and white, and the efficiency of color change remained constant even after repetition.

Comparative Example 2

An image display apparatus of Comparative Example 2 was prepared in a similar manner to Example 2, except that the compound represented by Formula (14) and 2-(2'-hydroxy-5'-t-butylphenyl)benzotriazole used in the layer containing the fluorescent brightener and the ultraviolet absorber in Example 2 were replaced by ISCLARL (trade name) manufactured by Sumitomo 3M.

The composition containing ISCLARL (trade name) manufactured by Sumitomo 3M was confirmed to have an absorbance of 85% for light having a wavelength of 410 nm.

Light from a high-pressure mercury lamp was irradiated on the image display apparatus of Comparative Example 2 for 120 hours in a similar manner to Example 1, and visual observation revealed that the density of the color during color development decreased and the transparency during decoloration also decreased.

Thus, the image display apparatus according to the invention was shown to be superior in the display performance during repetition.

Example 3

A guest-host liquid crystal element was prepared in a similar manner to Example 2, except that the two-frequency driving liquid crystal 1 described above was used as the host liquid crystal in the liquid crystal element described in Example 2.

When a low-frequency AC voltage (20 V) at 100 Hz and a high-frequency AC voltage at 100 kHz were applied to the element obtained element by using a signal generator (manufactured by Toyo Corporation), the element turned white when the low-frequency AC electric field was applied and black when the high-frequency AC electric field was applied; and, when the frequency was switched, the element changed its color between black and white alternately and the efficiency of color change remained constant. Then, light from a high-pressure mercury lamp was irradiated on the image display apparatus according to the invention for 120 hours, and the same experiment was repeated, but the efficiency in the color change was preserved.

Example 4

An image display apparatus was prepared in a similar manner to Example 2, except that the compound represented by Formula (14) used as the fluorescent brightener was changed to the compound represented by each Formula (4), (13) and (19).

When an AC voltage (20 V, 100 Hz) was applied to the element obtained by using a signal generator (manufactured by Toyo Corporation), the element turned yellow in color only in the region where the voltage was applied. When on/off of the AC voltage was repeated 10,000 times, the element turned color alternately between yellow and white, and the efficiency of color change remained constant even after repetition.

All of the compositions containing the fluorescent brightener and ultraviolet absorber were shown to absorb 90% or more of light having a wavelength of 200 nm to 410 nm.

What is claimed is:

1. An image display apparatus, comprising a substrate, a transparent electrode layer, a field-effect transistor that comprises a gate insulator and a semiconductive layer containing an organic compound, a display layer having optical properties that change in response to an electric field, and a layer containing a fluorescent brightener that absorbs 90% or more of light having a wavelength of 200 nm to 410 nm;
wherein the display layer is an electrophoretic display layer comprising a dispersion of colored, charged fine particles dispersed in a dispersion medium.

2. The image display apparatus of claim 1, wherein the layer containing a fluorescent brightener further comprises an ultraviolet absorber.

3. The image display apparatus of claim 1, wherein the fluorescent brightener is a benzoxazole derivative.

4. The image display apparatus of claim 3, wherein the benzoxazole derivative is represented by the following Formula (1):

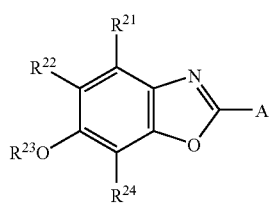

Formula (1)

wherein $R^{21}$ and $R^{24}$ each represent a hydrogen atom, an alkyl group or an alkoxy group; $R^{22}$ and $R^{23}$ each represent an alkyl group; and A represents a substituted aryl group or a substituted ethenyl group.

5. The image display apparatus of claim 3, wherein the benzoxazole derivative is represented by the following Formula (5):

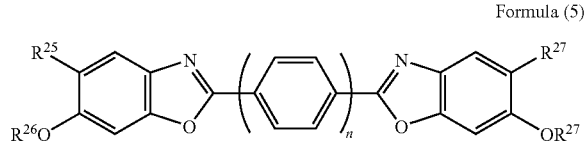

Formula (5)

wherein $R^{25}$, $R^{26}$, $R^{27}$ and $R^{28}$ each represent an alkyl group; and n is 1 or 2.

6. The image display apparatus of claim 1, wherein the semiconductive layer further comprises a π-conjugated compound.

7. The image display apparatus of claim 1, wherein the semiconductive layer further comprises one selected from the group consisting of a polythiophene derivative, a polyethylene-polythiophene copolymer derivative, a polyfluorene derivative, a polyphenylene derivative, a phthalocyanine derivative, a pentacene derivative, a fullerene derivative, and a carbon nanotube derivative.

8. The image display apparatus of claim 1, wherein the semiconductive layer further comprises pentacene or oligothiophene.

9. The image display apparatus of claim 1, wherein the dispersion medium is a non-aqueous organic solvent.

10. The image display apparatus of claim 9, wherein the non-aqueous organic solvent is selected from the group consisting of hydrocarbons and aromatic hydrocarbon compounds.

11. The image display apparatus of claim 1, wherein the colored, charged particles comprise charged particles selected from the group consisting of silica, alumina, zirconia, titanium oxide, tungsten oxide, zinc oxide, tin oxide, barium titanate and carbon black.

12. The image display apparatus of claim 1, wherein the electrophoretic display layer comprises charged white particles and charged black particles, the white particles being selected from the group consisting of titanium oxide, silica gel and alumina, and the charged black particles being carbon black.

13. The image display apparatus of claim 1, wherein the colored, charged fine particles are surface-modified.

14. The image display apparatus of claim 13, wherein the colored, charged fine particles are surface-modified with a coupling agent selected from the group consisting of a titanium coupling agent, a silane coupling agent, and an aluminum coupling agent, or by graft polymerization.

15. The image display apparatus of claim 1, wherein the fluorescent brightener-containing layer is formed on the face of the substrate opposite to the display layer.

* * * * *